US012446208B2

United States Patent
Alzate-Vinasco et al.

(10) Patent No.: US 12,446,208 B2
(45) Date of Patent: Oct. 14, 2025

(54) MULTILEVEL WORDLINE ASSEMBLY FOR EMBEDDED DRAM

(71) Applicant: Intel Corporation, Santa Clara, CA (US)

(72) Inventors: Juan G. Alzate-Vinasco, Tigard, OR (US); Travis W. LaJoie, Forest Grove, OR (US); Elliot N. Tan, Portland, OR (US); Kimberly Pierce, Beaverton, OR (US); Shem Ogadhoh, West Linn, OR (US); Abhishek A. Sharma, Portland, OR (US); Bernhard Sell, Portland, OR (US); Pei-Hua Wang, Hillsboro, OR (US); Chieh-Jen Ku, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 965 days.

(21) Appl. No.: 17/358,954

(22) Filed: Jun. 25, 2021

(65) Prior Publication Data
US 2022/0415897 A1    Dec. 29, 2022

(51) Int. Cl.
*H10D 30/67* (2025.01)
*H10B 12/00* (2023.01)
*H10D 30/01* (2025.01)

(52) U.S. Cl.
CPC ....... *H10B 12/315* (2023.02); *H10B 12/0335* (2023.02); *H10B 12/05* (2023.02); *H10D 30/031* (2025.01); *H10D 30/6728* (2025.01)

(58) Field of Classification Search
CPC .. H10B 12/315; H10B 12/0335; H10B 12/05; H10B 12/488; H01L 29/66742; H01L 29/78642; H10D 30/031; H10D 30/6728
See application file for complete search history.

(56) References Cited

U.S. PATENT DOCUMENTS

| 2011/0027989 A1* | 2/2011 | Mayer ............... H01L 21/76825 |
| | | 257/E21.585 |
| 2012/0228688 A1* | 9/2012 | Matsubayashi ........ H10D 86/60 |
| | | 257/296 |

(Continued)

OTHER PUBLICATIONS

Extended European Search Report from European Patent Application No. 22179999.2 notified Oct. 31, 2022, 10 pgs.

(Continued)

*Primary Examiner* — S M Sohel Sohel Imtiaz
(74) *Attorney, Agent, or Firm* — Essential Patents Group, LLP

(57) ABSTRACT

A device structure includes a first interconnect line along a longitudinal direction and a second interconnect line parallel to the first interconnect line, where the first interconnect structure is within a first metallization level and the second interconnect line is within a second metallization level. A first transistor and a laterally separated second transistor are on a same plane above the second interconnect line, where a gate of the first transistor is coupled to the first interconnect line and a gate of the second transistor is coupled to the second interconnect line. A first capacitor is coupled to a first terminal of the first transistor and a second capacitor is coupled to a first terminal of the second transistor. A third interconnect line couples a second terminal of the first transistor with a second terminal of the second transistor.

11 Claims, 18 Drawing Sheets

(56) References Cited

U.S. PATENT DOCUMENTS

| | | | | |
|---|---|---|---|---|
| 2013/0039113 A1* | 2/2013 | Cremer | ............... | H10B 12/482 |
| | | | | 365/72 |
| 2016/0111382 A1* | 4/2016 | Aubel | ............... | H01L 23/53238 |
| | | | | 257/773 |
| 2019/0035791 A1* | 1/2019 | Zang | ................... | H10D 86/451 |
| 2019/0304897 A1* | 10/2019 | Lajoie | ............... | H10B 12/0335 |
| 2019/0326299 A1* | 10/2019 | Wang | ..................... | H10D 86/40 |
| 2019/0333917 A1* | 10/2019 | Ramaswamy | ....... | H10D 30/025 |
| 2019/0393224 A1* | 12/2019 | Wang | ..................... | H10D 1/716 |
| 2019/0393356 A1* | 12/2019 | Le | ........................ | H10D 30/031 |
| 2020/0098931 A1* | 3/2020 | Sharma | ................. | H10D 86/60 |
| 2020/0152623 A1* | 5/2020 | Kocon | ................ | H10D 30/603 |
| 2021/0036162 A1* | 2/2021 | Rigano | .............. | H10D 30/0415 |
| 2021/0082921 A1* | 3/2021 | Wada | ................... | H10B 12/036 |
| 2022/0059694 A1* | 2/2022 | Luo | ..................... | H10B 12/315 |
| 2022/0122971 A1* | 4/2022 | Peng | .................. | H01L 23/5225 |
| 2022/0367489 A1* | 11/2022 | Chang | ................ | H01L 23/5256 |

OTHER PUBLICATIONS

Hashimoto, Masashi, et al., "An Embedded DRAM Module using a Dual Sense Amplifier Architecture in a Logic Process", 1997 IEEE International Solid-State Circuits Conference, 3 pgs.

* cited by examiner

B-B'

D-D'

MULTILEVEL WORDLINE ASSEMBLY FOR EMBEDDED DRAM

BACKGROUND

Generally, interconnect lines are arranged in a manner where a series of word lines extend longitudinally in a first direction and are spatially limited to a first plane, and series of bit lines are orthogonal to word lines and extend longitudinally on a second plane. As memory devices that are connected to word lines and bit lines are scaled in size and spacing, word lines (and bit lines) that are on a single plane are brought closer together. Such an arrangement may cause an increase in word line capacitance for example. Thus, it is necessary to explore interconnect architecture to enable memory device scaling while simultaneously minimizing additional capacitance.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Also, various physical features may be represented in their simplified "ideal" forms and geometries for clarity of discussion, but it is nevertheless to be understood that practical implementations may only approximate the illustrated ideals. For example, smooth surfaces and square intersections may be drawn in disregard of finite roughness, corner-rounding, and imperfect angular intersections characteristic of structures formed by nanofabrication techniques. Further, where considered appropriate, reference labels have been repeated among the figures to indicate corresponding or analogous elements.

DETAILED DESCRIPTION

Figure 1A:
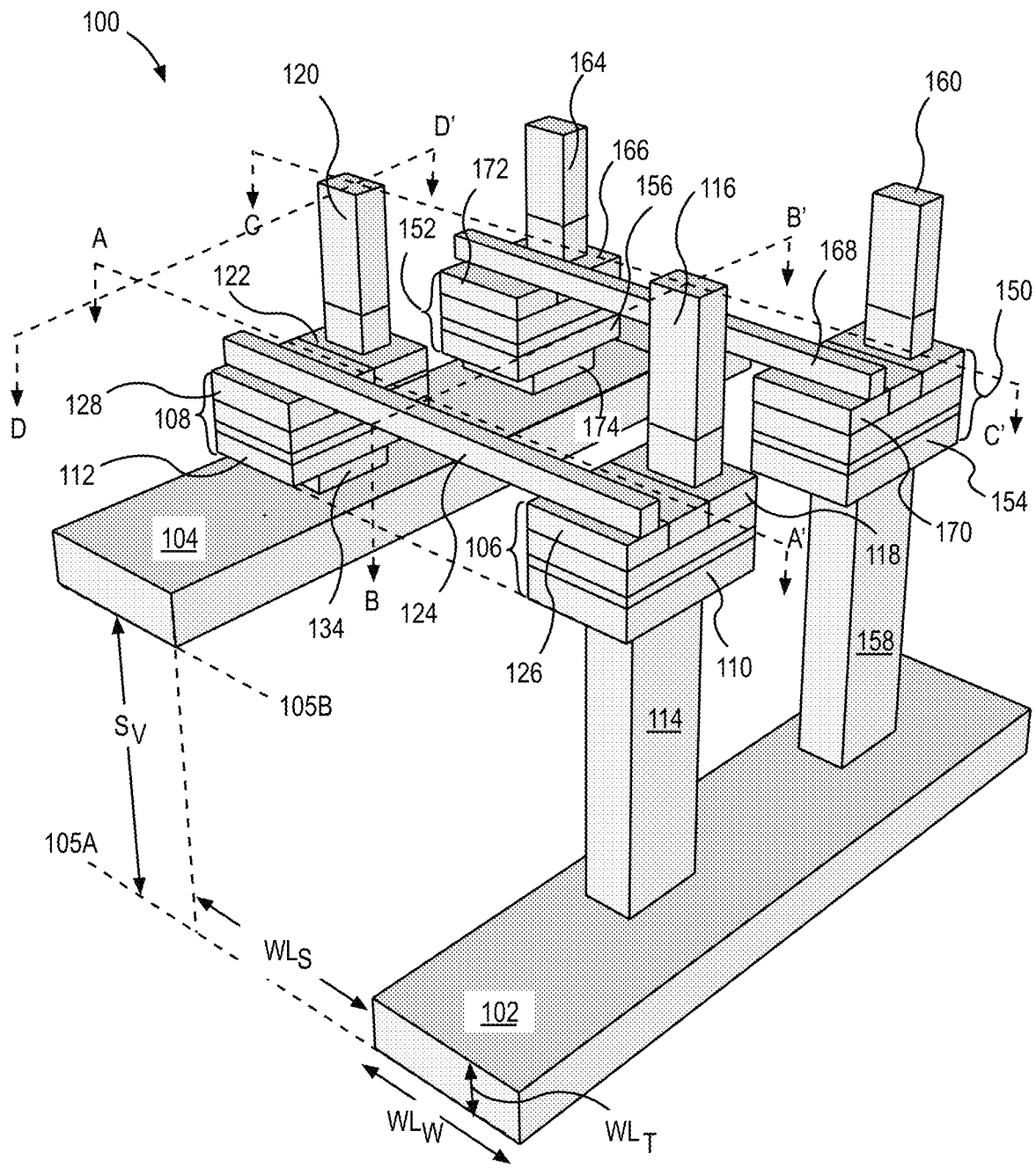
FIG. 1A illustrates an isometric illustration of a device structure including a pair of word lines that are separated vertically, in accordance with an embodiment of the present disclosure.

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Also, various physical features may be represented in their simplified "ideal" forms and geometries for clarity of discussion, but it is nevertheless to be understood that practical implementations may only approximate the illustrated ideals. For example, smooth surfaces and square intersections may be drawn in disregard of finite roughness, corner-rounding, and imperfect angular intersections characteristic of structures formed by nanofabrication techniques. Further, where considered appropriate, reference labels have been repeated among the figures to indicate corresponding or analogous elements.

Various multilevel wordline assembly for embedded DRAM are described. In the following description, numerous specific details are set forth, such as structural schemes and detailed fabrication methods in order to provide a thorough understanding of embodiments of the present disclosure. It will be apparent to one skilled in the art that embodiments of the present disclosure may be practiced without these specific details. In other instances, well-known features, such as transistor operations and operations associated with capacitors, are described in lesser detail in order to not unnecessarily obscure embodiments of the present disclosure. Furthermore, it is to be understood that the various embodiments shown in the Figures are illustrative representations and are not necessarily drawn to scale.

In some instances, in the following description, well-known methods and devices are shown in block diagram form, rather than in detail, to avoid obscuring the present disclosure. Reference throughout this specification to "an embodiment" or "one embodiment" or "some embodiments" means that a particular feature, structure, function, or characteristic described in connection with the embodiment is included in at least one embodiment of the disclosure. Thus, the appearances of the phrase "in an embodiment" or "in one embodiment" or "some embodiments" in various places throughout this specification are not necessarily referring to the same embodiment of the disclosure. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical, electrical or in magnetic contact with each other, and/or that the two or more elements co-operate or interact with each other (e.g., as in a cause an effect relationship).

The terms "over," "under," "between," and "on" as used herein refer to a relative position of one component or material with respect to other components or materials where such physical relationships are noteworthy. For example, in the context of materials, one material or material disposed over or under another may be directly in contact or may have one or more intervening materials. Moreover, one material disposed between two materials may be directly in contact with the two layers or may have one or more intervening layers. In contrast, a first material "on" a second material is in direct contact with that second material/material. Similar distinctions are to be made in the context of component assemblies. As used throughout this description, and in the claims, a list of items joined by the term "at least one of" or "one or more of" can mean any combination of the listed terms.

The term "adjacent" here generally refers to a position of a thing being next to (e.g., immediately next to or close to with one or more things between them) or adjoining another thing (e.g., abutting it).

The term "signal" may refer to at least one current signal, voltage signal, magnetic signal, or data/clock signal. The meaning of "a," "an," and "the" include plural references. The meaning of "in" includes "in" and "on."

The term "device" may generally refer to an apparatus according to the context of the usage of that term. For example, a device may refer to a stack of layers or structures, a single structure or layer, a connection of various structures having active and/or passive elements, etc. Generally, a device is a three-dimensional structure with a plane along the x-y direction and a height along the z direction of an x-y-z Cartesian coordinate system. The plane of the device may also be the plane of an apparatus which comprises the device.

As used throughout this description, and in the claims, a list of items joined by the term "at least one of" or "one or more of" can mean any combination of the listed terms.

Unless otherwise specified in the explicit context of their use, the terms "substantially equal," "about equal" and "approximately equal" mean that there is no more than incidental variation between two things so described. In the art, such variation is typically no more than +/−10% of a predetermined target value.

The terms "left," "right," "front," "back," "top," "bottom," "over," "under," and the like in the description and in the claims, if any, are used for descriptive purposes and not necessarily for describing permanent relative positions. For example, the terms "over," "under," "front side," "back side," "top," "bottom," "over," "under," and "on" as used herein refer to a relative position of one component, structure, or material with respect to other referenced components, structures or materials within a device, where such physical relationships are noteworthy. These terms are employed herein for descriptive purposes only and predominantly within the context of a device z-axis and therefore may be relative to an orientation of a device. Hence, a first material "over" a second material in the context of a figure provided herein may also be "under" the second material if the device is oriented upside-down relative to the context of the figure provided. In the context of materials, one material disposed over or under another may be directly in contact or may have one or more intervening materials. Moreover, one material disposed between two materials may be directly in contact with the two layers or may have one or more intervening layers. In contrast, a first material "on" a second material is in direct contact with that second material. Similar distinctions are to be made in the context of component assemblies.

The term "between" may be employed in the context of the z-axis, x-axis or y-axis of a device. A material that is between two other materials may be in contact with one or both of those materials, or it may be separated from both of the other two materials by one or more intervening materials. A material "between" two other materials may therefore be in contact with either of the other two materials, or it may be coupled to the other two materials through an intervening material. A device that is between two other devices may be directly connected to one or both of those devices, or it may be separated from both of the other two devices by one or more intervening devices.

In semiconductor devices such as DRAMs (Dynamic Random-Access Memory), generally each memory cell (bitcell) includes one transistor (such as a thin-film-transistor or TFT) and one capacitor for storing a bit (logical 1 or 0). TFTs may be moved to the back end of line (BEOL) layers of an advanced complementary metal-oxide-semiconductor (CMOS) process, which means that their corresponding capacitors can be implemented in the upper metal layers with correspondingly thicker inter-layer dielectric (ILD) and larger metal pitch to achieve higher capacitance.

Interconnect lines or word lines (WLs) in back-end-of-the-line (BEOL) TFT-based embedded DRAM utilizes dense metal lines that are parallel to each other and exit the array and connect to WL drivers. However, architectures considered for scaled embedded DRAM such as 6F$^2$ cells or angled arrays may impose strict pitch limitations on a WL layout. With device scaling, reduction in feature sizes of transistors and spacing between adjacent transistors also reduces spacing between interconnect lines that are coupled with the transistors. A reduction in WL to WL spacing can increase WL capacitance. To preserve capacitance, it becomes necessary to reduce a width of the WLs. However, reduction in WL width can increase electrical line resistance. Increase in electrical line resistance can effectively increase ramp up and ramp down times of WLs, slowing down a bitcell operation.

To solve problems arising from increased capacitance and increased line resistance, a pair of parallel word lines can be vertically spaced apart, i.e., on two different levels. For example, a first WL in the pair of parallel word lines may be on a lower level and a second WL on an upper level. Vertical spacing can enable two such WLs to be brought closer as spacing between two adjacent transistors (one transistor coupled to each WL) are reduced. The vertical space between two such word lines may be typically occupied with a material having a low dielectric constant (low-K).

In exemplary examples, each word line, extending longitudinally, may include an array of thousands of transistors that are longitudinally spaced apart. In general, the arrays of transistors that are coupled to each WL pair, are on a single plane above each WL, even though the WLs in the WL pair themselves are on two different levels. Each transistor in a single longitudinal array can be coupled to an upper or a lower WL by a single via. For example, a short via may be utilized to couple each transistor in a first array to a wordline on an upper level. Likewise, a tall via may be utilized to couple each transistor in a second array to a wordline on a lower level. Both short and tall vias can have smaller footprints compared to a surface area of the WL on which they land. Because a tall via has a vertical dimension that is significantly less than a length of a WL, the tall via does not appreciably increase capacitance.

In some embodiments, vertical separation between two WLs can also facilitate lateral overlap between the WLs on two different levels. A lateral overlap between two WLs can prevent a need to reduce line width because pitch requirements can be relaxed for all WLs on a given upper and lower level.

In a different embodiment, a single transistor may span across an upper and lower WL pair. A second transistor may be directly adjacent to a first transistor, where both transistors span over two vertically separated upper and lower WLs. In some such transistor architectures, the two transistors may share a common source or a drain terminal, channel layer and a gate dielectric to further increase DRAM density. In one such embodiment, each transistor includes a separate gate electrode and an opposite of the drain or the source terminal to the shared source or drain terminal. To provide memory storage, each transistor may be coupled to a capacitor, such as a metal-insulator-metal (MIM) capacitor extending over a respective non-shared source or drain terminal of each transistor. To tune a capacitor size, the MIM capacitor may span over more than one WL.

In accordance with an embodiment of the present disclosure, a device structure includes a first interconnect line along a longitudinal direction where the first interconnect structure is within a first metallization level. A second interconnect line is parallel to the first interconnect line where the second interconnect line is within a second metallization level. A first transistor and a second transistor are on a same plane. The second transistor is laterally separated from the first transistor, where a gate of the first transistor is coupled to the first interconnect line and a gate of the second transistor is coupled to the second interconnect line. A via is between the first interconnect line and the gate of the first transistor. A first capacitor is coupled to a first terminal of the first transistor and a second capacitor is coupled to a first terminal of the second transistor. A third interconnect line couples a second terminal of the first transistor with a second terminal of the second transistor. The second interconnect line extends along a direction orthogonal to the longitudinal direction.

FIG. 1A is an isometric illustration of a device structure 100. The device structure 100 includes an interconnect line 102 along a longitudinal direction (y-direction) where the interconnect structure 102 is within a lower metallization level 105A. An interconnect line 104 is parallel to the interconnect line 102 where the interconnect line 104 is within an upper metallization level 105B. Interconnect lines 102 and 104 may be herein referred to as word lines 102 and 104, respectively. Word lines 102 and 104 are vertically separated by a distance, Sy. In some embodiments, Sv is at least 20 nm but less than 200 nm.

The device structure 100 further includes a plurality of transistors such as transistor 106 and a transistor 108. Transistors 106 and 108 may be thin-film-transistors (TFTs) utilized in a back-end-of-the-line (BEOL). Transistors 106 and 108 may be back gated as shown, where a respective gate of transistors 106 and 108 is below source and drain terminals. As shown, transistors 106 and 108 are on a same plane. The transistor 108 is laterally separated from the transistor 106 where a gate 110 of the transistor 106 is coupled to the interconnect line 102 and a gate 112 of transistor 108 is coupled to the interconnect line 104. A via 114 is between the interconnect line 102 and the gate 110 of the transistor 106. The device structure 100 further includes a capacitor 116 coupled to a terminal 118 of the transistor 106 and a capacitor 120 coupled to a terminal 122 of the transistor 108. Each transistor-capacitor combination such transistor 106 and capacitor 116, for example, constitutes a memory bitcell.

For operational advantages the interconnect line 124 couples a terminal 126 of the transistor 106 with a terminal 128 of the transistor 108. The interconnect line 124 extends, along the x-direction, orthogonal to the word lines 102 and 104.

Word lines 102 and 104 can be laterally separated or overlap. In the illustrative embodiment, the word lines 102 and 104 are laterally separated by a distance, $WL_S$. Because of vertical separation, word lines 102 and 104 can be laterally brought closer together (decreasing $WL_S$) without prohibitively increasing capacitance. Lateral separation, $WL_S$, may be determined by a minimum spacing between transistors 106 and 108 connected to the word lines 102 and 104, respectively. $WL_S$ may also be dependent on a lateral width (along x-direction) of the capacitors 116 and 120. The word lines 102 and 104 each have a lateral width, $WL_W$ and a thickness $WL_T$, where and $WL_W$ and $WL_T$ may be dependent on a minimum line resistance required. In some embodiments, $WL_T$ is between 10-50 nm and $WL_W$ is between 10-50 nm.

Figure 1B:
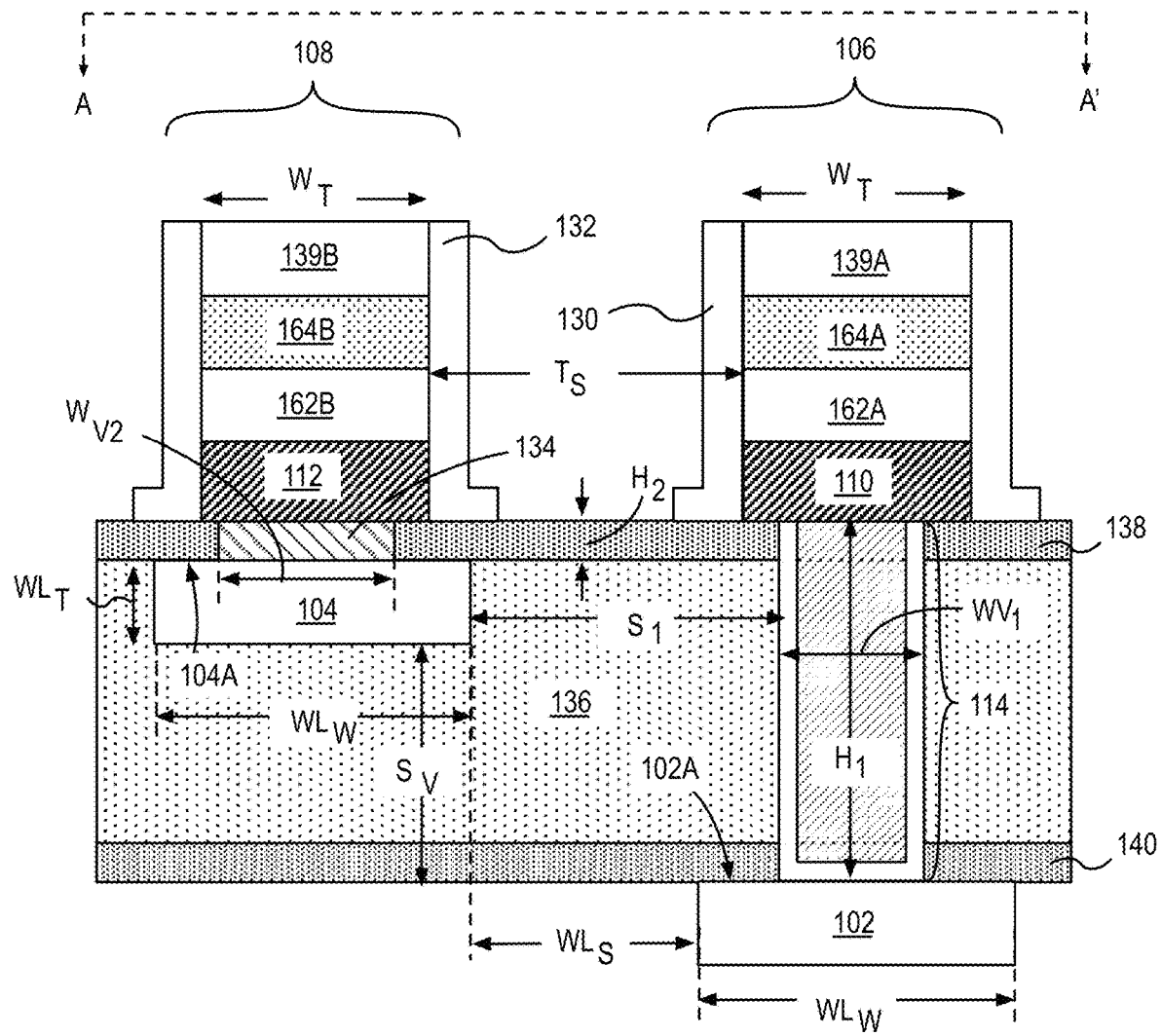
FIG. 1B illustrates a cross-sectional view through a line A-A' of the device structure in FIG. 1A.

FIG. 1B is a cross-sectional illustration of the structure in FIG. 1A through a line A-A'. FIG. 1B includes one or more layers that are omitted in FIG. 1A for clarity. In the illustrative embodiment, an upper portion of via 114 is laterally surrounded by an etch stop layer 138 and a lower portion of via 114 is surrounded by etch stop layer 140. Additionally, as shown a dielectric 136 is between the etch stop layer 138 and etch stop layer 140. Dielectric 136 and etch stop layers 138 and 140 include materials that have a low dielectric constant to prevent capacitance build up in the word lines 102 and 104. The device structure 100 further includes a via 134 between transistor 108 and word line 104 where the via 134 is spatially confined within etch stop layer 138. As shown, word line 104 is laterally surrounded by dielectric 136 and etch stop layer 138 extends on a portion of an uppermost surface 104A of the word line 104.

Via 114 has a vertical thickness or height, $H_1$, as measured from an uppermost surface 102A of the word line 102. Via 134 has a vertical thickness or height, $H_2$, as measured from surface 104A. The etch stop layer 138 has a thickness that is substantially equal to $H_2$. In exemplary embodiments, $H_1$ is less than $H_2$. As shown, $H_1$ is substantially equal to a sum of $WL_T$, $H_2$ and $S_V$.

The dimensions and materials of the word lines 102 and 104 can be customized for the purpose of reducing word line resistance. As shown, word lines 102 and 104 each have a lateral width (along the x-direction), $WL_W$ and a vertical thickness, $WL_T$ (along the x, and z directions, respectively). A total cross-sectional area, given by a product of $WL_W$ and $WL_T$ determine the conductance in the word lines 102 and 104. In addition to the cross-sectional area, conductivity of word lines 102 and 104 is determined by a choice of materials utilized. The word lines 102 and 104 may include a material such as copper or aluminum. In exemplary embodiments, word lines 102 and 104 include copper.

Depending on embodiments, the transistors 106 and 108 may each have a lateral width that is either confined within or extend beyond the respective lateral width of word lines 102 and 104. Each of the transistors 106 and 108 has a respective lateral width, $W_T$, (also measured along the x-direction). In the illustrative embodiment, $WL_W$ is greater than $W_T$. $W_T$ may be determined by a target pitch/density of memory bit cells, and transistor performance characteristics as $W_T$ can influence drive current.

In the illustrative embodiment, transistors 106 and 108 are laterally separated by a distance, $T_S$. $T_S$ is determined partially by a lateral thickness of a spacer 130 adjacent to transistor 106 and a spacer 132 adjacent to transistor 108. In the illustrative embodiment, $WL_S$ is less than $T_S$. In some embodiments, $WL_S$ is between 5 nm and 50 nm. In other embodiments, word lines 102 and 104 extend laterally such that a spacing, $S_1$, between the word line 104 and via 114 is non-zero. In some embodiments, $S_1$ can be 10 nm or less but greater than 1 nm. It is to be appreciated that flexibility in reducing $S_1$, by scaling $WL_W$ can be advantageous when transistors are scaled, and $T_S$ is reduced between them. Independently scaling $WL_W$ can advantageously facilitate a minimum line conductivity of word lines 102 and 104 to be preserved when $W_T$ and $T_S$ are reduced. Reducing transistor gate lengths (into a plane of the Figure) and $W_T$ can increase memory density. However, as illustrated, vertical separation $S_V$ can enable, $WL_W$ to be held fixed as $W_T$ is scaled.

Figure 1C:
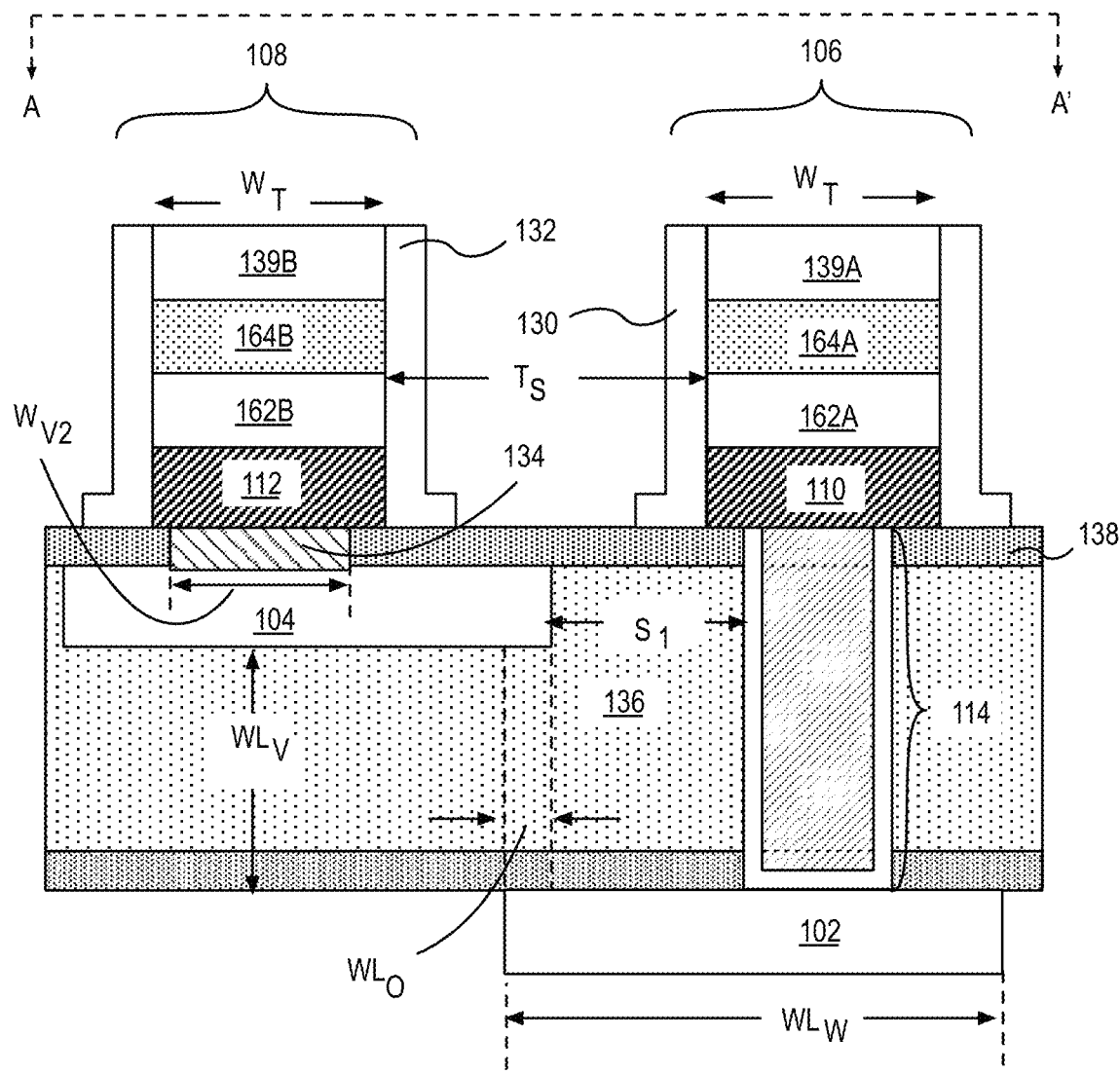
FIG. 1C illustrates a cross-sectional view through a line A-A' of the device structure in FIG. 1A, in an embodiment where word lines overlap, in accordance with an embodiment of the present disclosure.
Figure 1C:
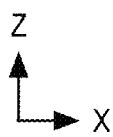

As discussed above, in some embodiments, word lines 102 and 104 can overlap when $T_S$ and/or $W_T$ is reduced, such as is illustrated in FIG. 1C. In some embodiments, the overlap, $W_{LO}$, is a result of reduction in spacing between transistors 106 and 108. Overlapping between word lines 102 and 104 can enable preserving a low line resistance, such as a line resistance below 5000 Ohm. The overlap may be also tuned to provide word lines 102 and 104 with a desired range of electrical line resistance. In some embodiments, the overlap, $W_{LO}$, may be between 0-20 nm.

$W_T$, $T_S$, $WL_W$ and $WL_S$ may be independently selected, however, there are limitations on how much the word lines 102 and 104 may extend laterally along the x-direction. In general, $WL_W$ is substantially the same for each word line 102 and 104. However, lateral width of the upper word line 104 is constrained compared to a lateral width of the lower word line 102 because of the presence of the via 114. As shown, via 114 is laterally distant from sidewall 104A of word line 104 by a spacing $S_1$. In embodiments, via 114 has a substantially vertical or a tapered sidewall. In the illustrative embodiment, via 114 has a substantially vertical sidewall [as measured from a normal to surface 102A] and $S_1$ is a minimum separation between the word line 104 and via 114. In embodiments, $S_1$ is at least 5 nm.

In various embodiments, via 114 has a footprint that is smaller than an uppermost surface of word line 102 and less than a width, $W_T$ of the transistor 106. Via 114 has a lateral width, $W_{V1}$ that is less than $W_T$ and $WL_W$. As shown via 114 is on a portion of uppermost surface 102A. In embodiments $W_{V1}$ is between 15-40 nm. In various embodiments, via 114 has a footprint that is smaller than an uppermost surface of word line 104 and less than a width, $W_T$ of the transistor 108. Via 118 has a maximum lateral width, $W_{V2}$ that is less than $W_T$ and $WL_W$.

Figure 1D:
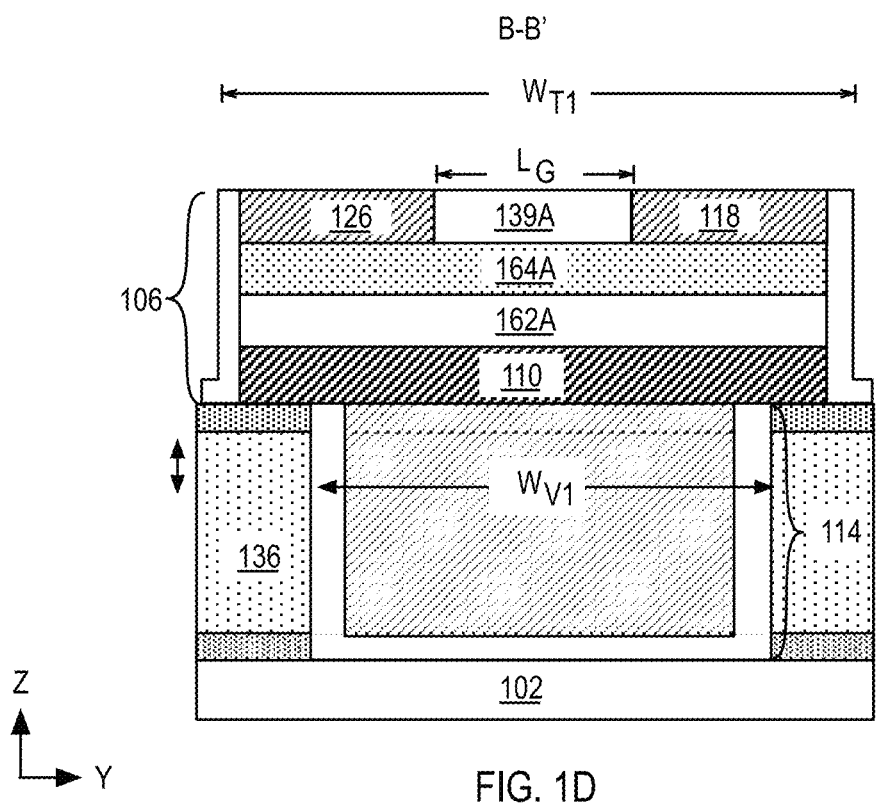
FIG. 1D illustrates a cross-sectional view of a first transistor coupled to a first word line on a lower lever through a deep via.

FIG. 1D is a cross-sectional illustration through a line B-B' of the structure in FIG. 1A. The capacitor 116 and interconnect line 124 are not shown for clarity. Depending on the relative width of via 114 and transistor 106, the via 114 may extend under different portions of the transistor 106. As shown transistor 106 has a lateral width, $W_{T1}$, and the via 114 has a lateral width, $W_{V1}$. In the illustrative embodiment, the via 114 extends laterally under terminals 126 and 118. As shown terminals 126 and 118 are isolated by a dielectric 139A. The lateral width of the dielectric 139A defines a gate length, $L_G$, of transistor 106. In an embodiment, terminals 126 and 118 may include any suitable electrically conductive material, alloy, or a stack of multiple electrically conductive materials. In some embodiments, terminals 126 and 118 include one or more metals or metal alloys, with metals e.g., copper, ruthenium, palladium, platinum, cobalt, nickel, hafnium, zirconium, titanium, tantalum, and aluminum, tantalum nitride, titanium nitride, tungsten, doped silicon, doped germanium, or alloys and mixtures of these. In some embodiments, terminals 126 and 118 includes one or more electrically conductive alloys, oxides, or carbides of one or more metals. In some embodiments, the terminals 126 and 118 includes a doped semiconductor, such as silicon or another semiconductor doped with an n-type dopant or a p-type dopant, or a compound semiconductor. Metals may provide higher conductivity, while doped semiconductors may be easier to pattern during fabrication. In some embodiments, the terminals 126 and 118 have a thickness (i.e., dimension measured along the z-axis) between about 2 nm and 1000 nm, preferably between about 2 nm and 100 nm.

Figure 1E:
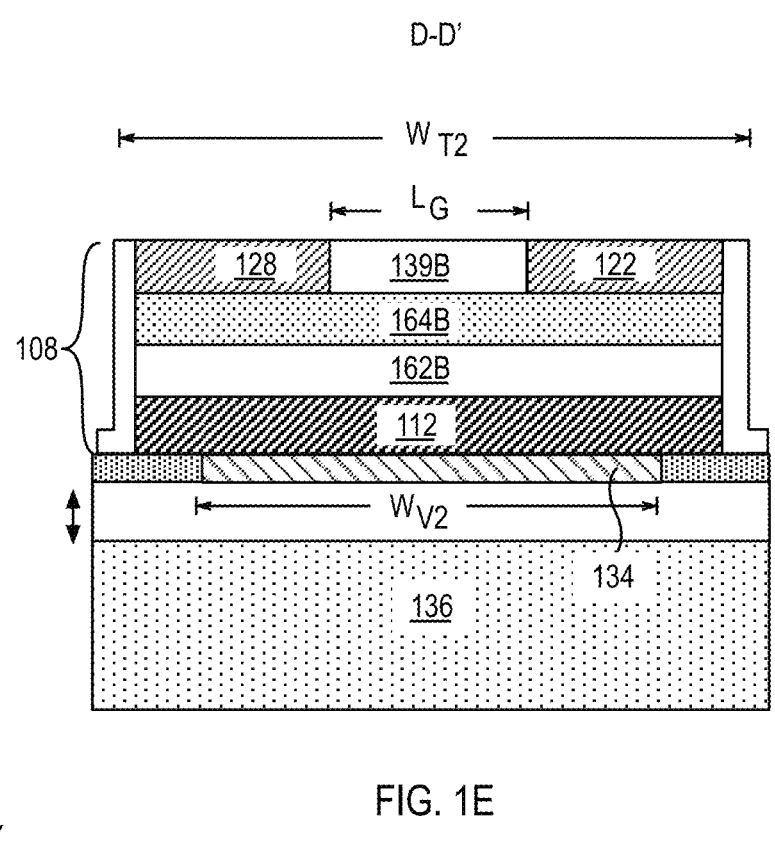
FIG. 1E illustrates a cross-sectional view of a second transistor coupled to a second word line on an upper level though a shallow via.

FIG. 1E is a cross-sectional illustration through a line D-D' of the structure in FIG. 1A. The capacitor 120 and interconnect line 124 are not shown for clarity. Depending on the relative width of the via 134 and transistor 108, the via 134 may extend under different portions of the transistor 108. In the illustrative embodiment, via 134 extends laterally under terminals 128 and 122. As shown transistor 106 has a lateral width, $W_{T2}$, and the via 134 has a lateral width, $W_{V2}$. In exemplary embodiments, $W_{T2}$ is greater than $W_{V2}$. As shown terminals 128 and 122 are isolated by a dielectric 139B. The lateral width of the dielectric 139B defines a gate length, $L_G$, of transistor 108. In exemplary embodiments, terminals 128 and 122 include a material that is the same or substantially the same as the material of the terminals 126 or 118 described in association with FIG. 1D.

Figure 1F:
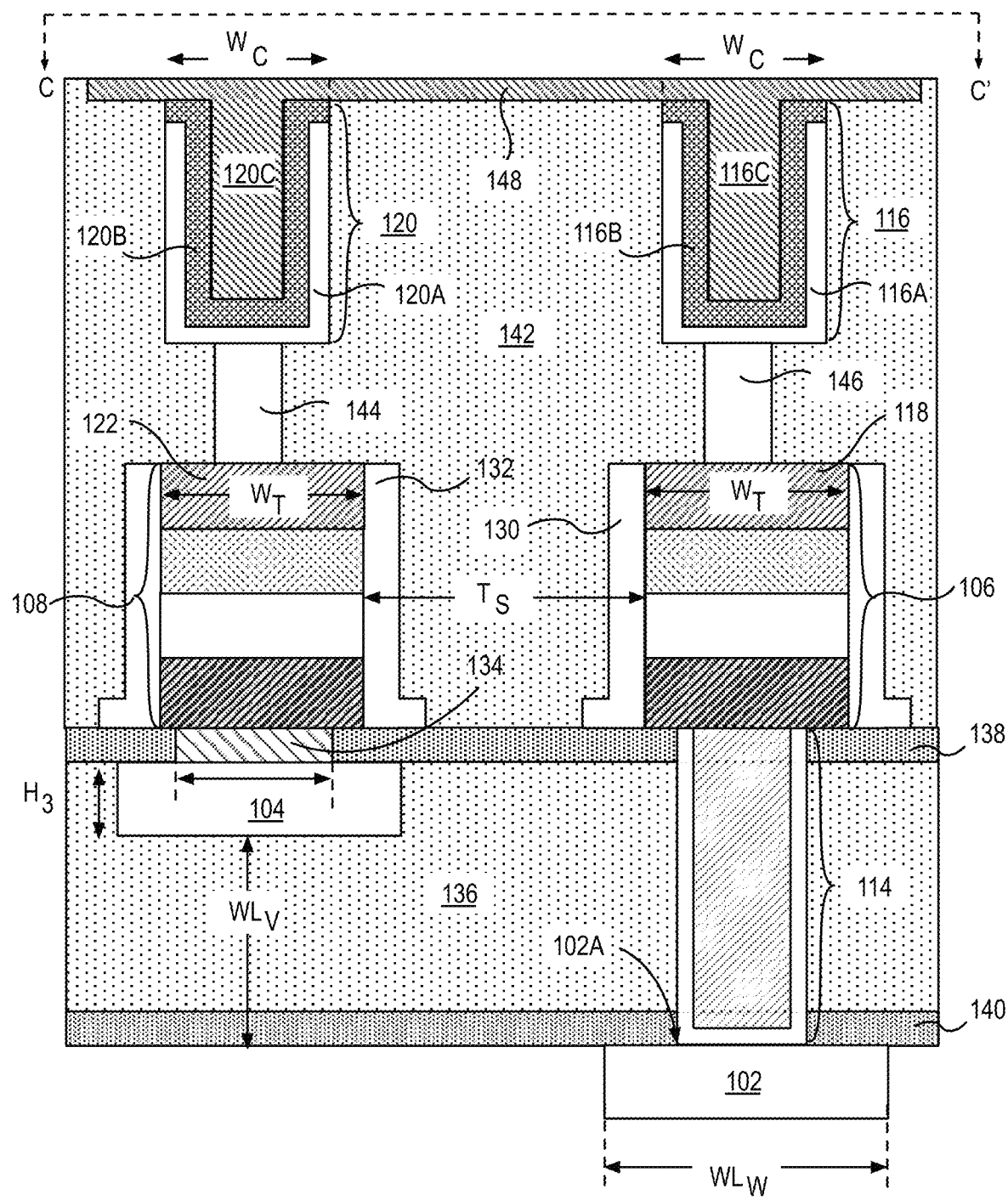
FIG. 1F illustrates a cross-sectional view of the first transistor coupled to a first capacitor and the second transistor coupled to a second capacitor, in accordance with an embodiment of the present disclosure.

FIG. 1F is a cross-sectional illustration through a line C-C' of the structure in FIG. 1A. FIG. 1F includes layers that are not illustrated in FIG. 1A such as dielectric 142. Capacitors 116 and 120 are laterally surrounded by dielectric 142. Capacitor 116 includes an electrode 116A, an insulator 116B on and adjacent to electrode 116A, and an electrode 116C on and adjacent to insulator 116B. Capacitor 120 includes an electrode 120A, an insulator 120B on and adjacent to electrode 120A, and an electrode 120C on and adjacent to the insulator 120B. As shown, terminal 116A of capacitor 116 is coupled to transistor 106 through an interconnect 146, and terminal 120A of capacitor 120 is coupled to transistor 108 through an interconnect 144. In the illustrative embodiment, interconnect 144 is coupled with terminal 122 and interconnect 146 is coupled with terminal 118. Interconnects 144 and 146 may have a wider or a narrower footprint compared to capacitors 116 or 120, respectively. As shown, the interconnects 144 and 146 have a narrower footprint compared to capacitors 116 and 120, respectively. In an embodiment, the electrodes 116A and 120A include a conductive material such as titanium nitride, tantalum and tantalum nitride. In an embodiment, the insulator 116B and 120B each include a dielectric material such as silicon dioxide, carbon-doped silicon glass or other low dielectric constant oxides. In an embodiment, the electrodes 116C and 120C each include a conductive material such as titanium nitride, tantalum and tantalum nitride.

In the illustrative embodiment, electrodes 116C and 120C, respectively, are electrically coupled by a bridging plate 148 that extends between the capacitors of 116 and 120. Electrically coupling electrodes 116C and 120C enables a single programming voltage to be applied on bridging plate 148. Programming of capacitors 116 and 120 can then be accomplished by individually applying voltages on electrodes 116A and 120A, respectively. In an embodiment, each of the capacitors 116 or 120 have a lateral width $W_C$. In exemplary embodiments, $W_C$ is substantially the same for each capacitor 116 and 120. $W_C$ may be less than or greater than $W_T$.

Referring again to FIG. 1B, transistors 106 and 108 include gate electrodes 110 and 112, respectively, gate dielectric layers 162A and 162B, respectively, and channel layers 164A and 164B, respectively. In the illustrative embodiment, isolation 139A and 139B are above the channel layers 164A and 164B, respectively. Terminals 118, 122, 126 and 128 are not illustrated in the cross-sectional illustration.

The channel layers 164A and 164B may include semiconductor materials including, for example, n-type or p-type materials. In some embodiments, the channel layers 164A and 164B may include a high mobility oxide semiconductor material, such as tin oxide, antimony oxide, indium oxide, indium tin oxide, titanium oxide, zinc oxide, indium zinc oxide, indium gallium zinc oxide, gallium oxide, titanium oxynitride, ruthenium oxide, or tungsten oxide. In general, the channel layers 164A and 164B may include one or more of tin oxide, cobalt oxide, copper oxide, antimony oxide, ruthenium oxide, tungsten oxide, zinc oxide, gallium oxide, titanium oxide, indium oxide, titanium oxynitride, indium tin oxide, indium zinc oxide, nickel oxide, niobium oxide, copper peroxide, indium gallium zinc oxide (IGZO), indium telluride, molybdenite, molybdenum diselenide, tungsten diselenide, tungsten disulfide, n- or p-type amorphous or polycrystalline silicon, germanium, indium gallium arsenide, silicon germanium, gallium nitride, aluminum gallium nitride, indium phosphite, and black phosphorus, each of which may possibly be doped with one or more of gallium, indium, aluminum, fluorine, boron, phosphorus, arsenic, nitrogen, tantalum, tungsten, and magnesium, etc. In particular, the channel layers 164A and 164B may be formed of a thin film material. Some such materials may be deposited at relatively low temperatures, which allows depositing them within the thermal budgets imposed on back-end fabrication to avoid damaging any front-end components. In some embodiments, the channel layers 164A and 164B may have a thickness between about 5 nm and 30 nm.

In various embodiments, the gate dielectric layers 162A and 162B includes one or more high-k dielectric materials and may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layers 162A and 162B may include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, tantalum oxide, tantalum silicon oxide, lead scandium tantalum oxide, and lead zinc niobate. In some embodiments, an annealing process may be carried out on the gate dielectric layers 162A and 162B during manufacture of the transistors 106 and 108 to improve the quality of the gate dielectric layers 162A and 162B. In some embodiments, the gate dielectric layers 162A and 162B have a thickness between about 0.5 nanometers and 3 nanometers, including all values and ranges therein, e.g., between about 1 and 3 nanometers, or between about 1 and 2 nanometers.

The gate electrodes 110 and 112 may include at least one p-type work function metal or n-type work function metal, depending on whether the transistors 106 and 108, respectively, are a P-type metal oxide semiconductor (PMOS) transistors or N-type metal oxide semiconductor (NMOS) transistors. For a PMOS transistor, the gate electrodes 110 and 112 may include a metal such as, but are not limited to, ruthenium, palladium, platinum, cobalt or nickel, or conductive metal oxides (e.g., ruthenium oxide). For an NMOS transistor, gate electrodes 110 and 112 may include a metal such as, but are not limited to hafnium, zirconium, titanium, tantalum, aluminum, or alloys of these metals, or carbides of these metals (e.g., hafnium carbide, zirconium carbide, titanium carbide, tantalum carbide, and aluminum carbide). In some embodiments, the gate electrodes 110 and 112 includes a stack of two or more metal layers, where one or more metal layers are work function metal layers and at least one metal layer is a fill metal layer. Further metal layers may be included for other purposes, such as to act as a diffusion barrier layer, where the diffusion barrier layer may be directly adjacent to the via 134 or 114.

Referring again to a FIG. 1A, device 100 further includes a transistor 150 and a transistor 152 on a same plane. The transistor 152 is laterally separated from the transistor 150 (along the x-direction). As shown a gate 154 of the transistor 150 is coupled to the word line 102 and a gate 156 of the transistor 152 is coupled to the word line 104. A via 158 is coupled between the word line 102 and gate 154 of transistor 150 and a via 174 is coupled between the word line 104 and gate 156. Device 100 further includes a capacitor 160 coupled to a terminal 162 of the transistor 150 and a capacitor 164 coupled to a terminal 166 of the transistor 152. As shown, an interconnect line 168 couples a terminal 170 of the transistor 150 with a terminal 172 of transistor 152. In the illustrative embodiment, interconnect line 168 extends along a direction parallel to the interconnect line 124.

In some embodiments, transistors 150 and 152 have one or more features of transistor 106 or 108. In exemplary embodiments transistors 150 and 152 are the same or substantially the same as transistors 106 or 108. In some embodiments, capacitors 160 and 164 have one or more features of capacitors 116 or 120. In exemplary embodiments capacitors 160 and 164 are the same or substantially the same as capacitors 116 or 120.

Although not shown, the word lines 102 and 104 extend along the y-direction and can accommodate hundreds of transistor, such as transistors 106 and 108, respectively, that is sufficient to fabricate at least 256K bitcell memory.

In other embodiments, device density can be increased with a similar word line structure as 102 and 104, but with a different transistor architecture. In some such embodiments, a pair of transistors can share one or more elements such as, for example, a channel layer and/or a terminal to reduce space between the transistors.

Figure 2A:
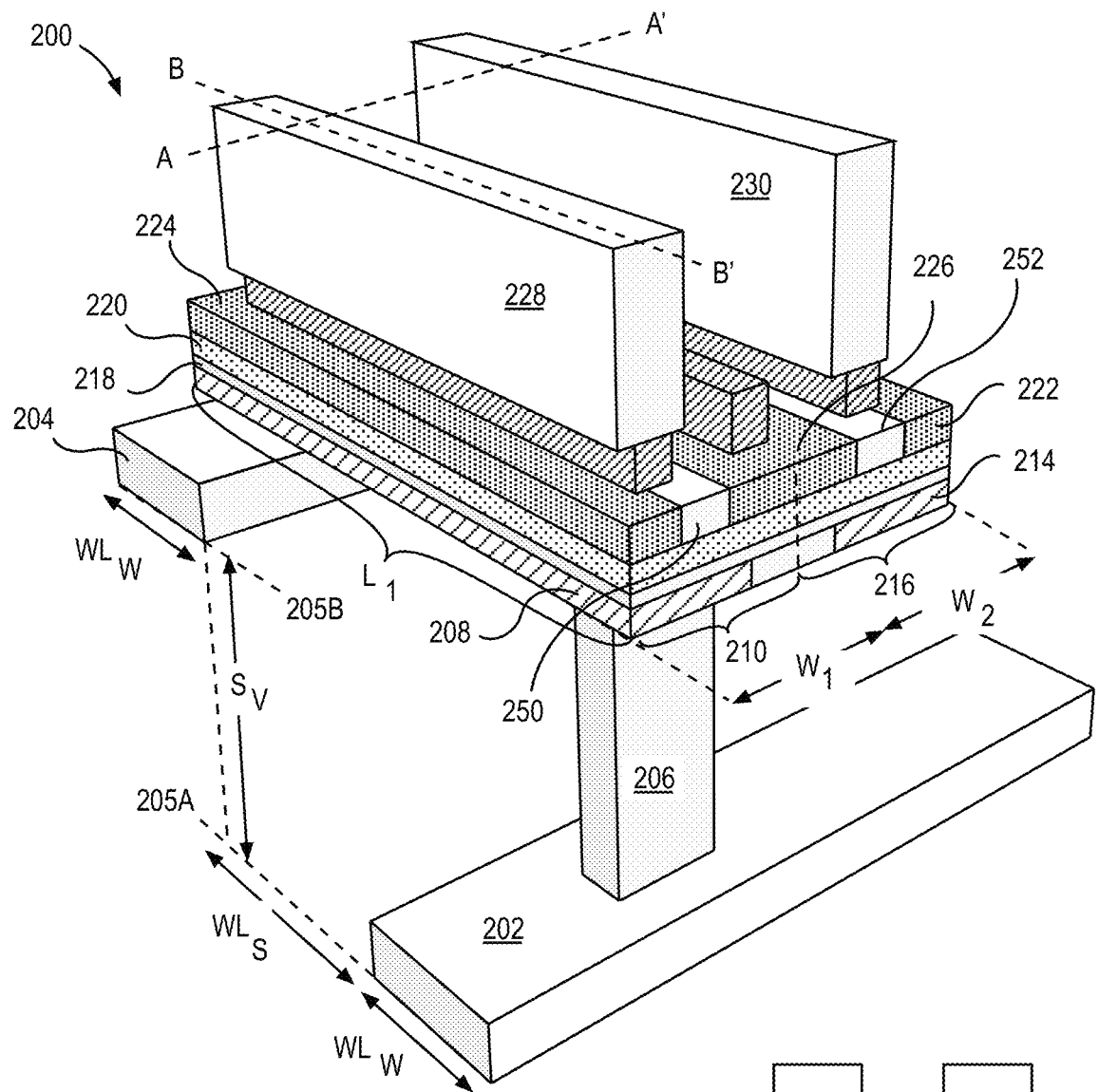
FIG. 2A illustrates an isometric illustration of a device structure including a pair of word lines that are separated vertically, and a pair of transistors orthogonally spanning the pair of word lines, in accordance with an embodiment of the present disclosure.

FIG. 2A is an isometric illustration of a device structure 200 that includes a pair of transistors 210 and 216 that each straddle a pair of word lines. As shown, device structure 200 includes a word line 202 and a word line 204, extending along a y-direction in the Figure. Word lines 202 and 204 are arranged identically to word lines 102 and 104, respectively and have one or more features of word lines 102 and 104 (described in association with FIGS. 1A-1F). Word line 202 is within a metallization level 205A, and word line 204 is within a metallization level 205B and is parallel to word line 202. The device structure 200 further includes a via 206 coupled between the word line 202 and a gate 208 of transistor 210. A via 212 (not visible) is also coupled between the word line 204 and a gate 214 of a transistor 216.

Figure 2D:
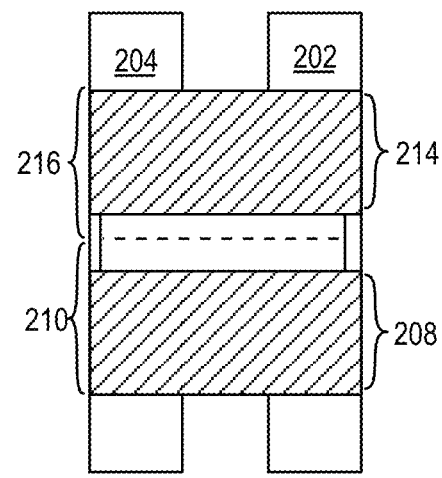
FIG. 2D is a plan-view illustration of the structure in FIG. 2A.

The transistors 210 and 216 include many shared components to facilitate a smaller footprint without loss of functionality. Each of the transistors 210 and 216 include a shared gate dielectric 218 (herein gate dielectric 218) on each of the respective gates 208 and 214, and a shared channel layer 220 (herein channel layer 220) on the gate dielectric 218. The transistors 210 and 216 also includes a shared terminal 226, where a portion of the terminal 226 is over the gate 208 and a portion of the terminal 226 is over gate 214. Shared terminal can simultaneously function as a source or a drain for transistors 210 and 216. Transistor 210 further includes a terminal 224 on a portion of the channel layer 220, where terminal 224 is separated from the terminal 226 by isolation 250. In the illustrative embodiment, terminal 224 is over a portion of the gate 214. Transistor 216 further includes a terminal 222 on a portion of the channel layer 220 where terminal 222 is separated from the terminal 226 by isolation 250. In the illustrative embodiment, terminal 224 is over a portion of the gate 214. It is to be appreciated that respective gates, channel layers, gate dielectric layers and terminals of each transistors 210 and 216 extend over each of the word lines 202 and 204 as illustrated in the plan view illustration of FIG. 2D taken across a plane through gates 208 and 214.

Referring again to FIG. 2A, transistors 210 and 216 each have a length $L_1$ and a width, $W_1$ and $W_2$, respectively. In embodiments, $L_1$ is less than a combined lateral widths, $WL_W$, of each word line 202 and 204, and spacing $WL_S$. Transistor 210 and 216 having a length $L_1$ that is less than or equal to $2WL_W+WL_S$ can facilitate a large collection of word line pairs. The terminals 222 and 224 is sufficiently long to provide a length for coupling with capacitors above. As shown, capacitor 228 is coupled to the terminal 224 and capacitor 230 coupled to the terminal 222. Capacitors 228 and 230 may also extend over both word lines 202 and 204 to provide a larger volume for increased charge storage. In the illustrative embodiment, capacitors 228 and 230 do not extend a full length of the transistor. In other examples, the capacitors 228 and 230 can extend a full length, $L_1$, of transistors 210 and 216.

Although not shown, the word lines 202 and 204 extend along the y-direction and can accommodate hundreds of transistor pairs, such as transistors 210 and 216, that is sufficient to fabricate at least 256K bitcell memory.

Figure 2B:
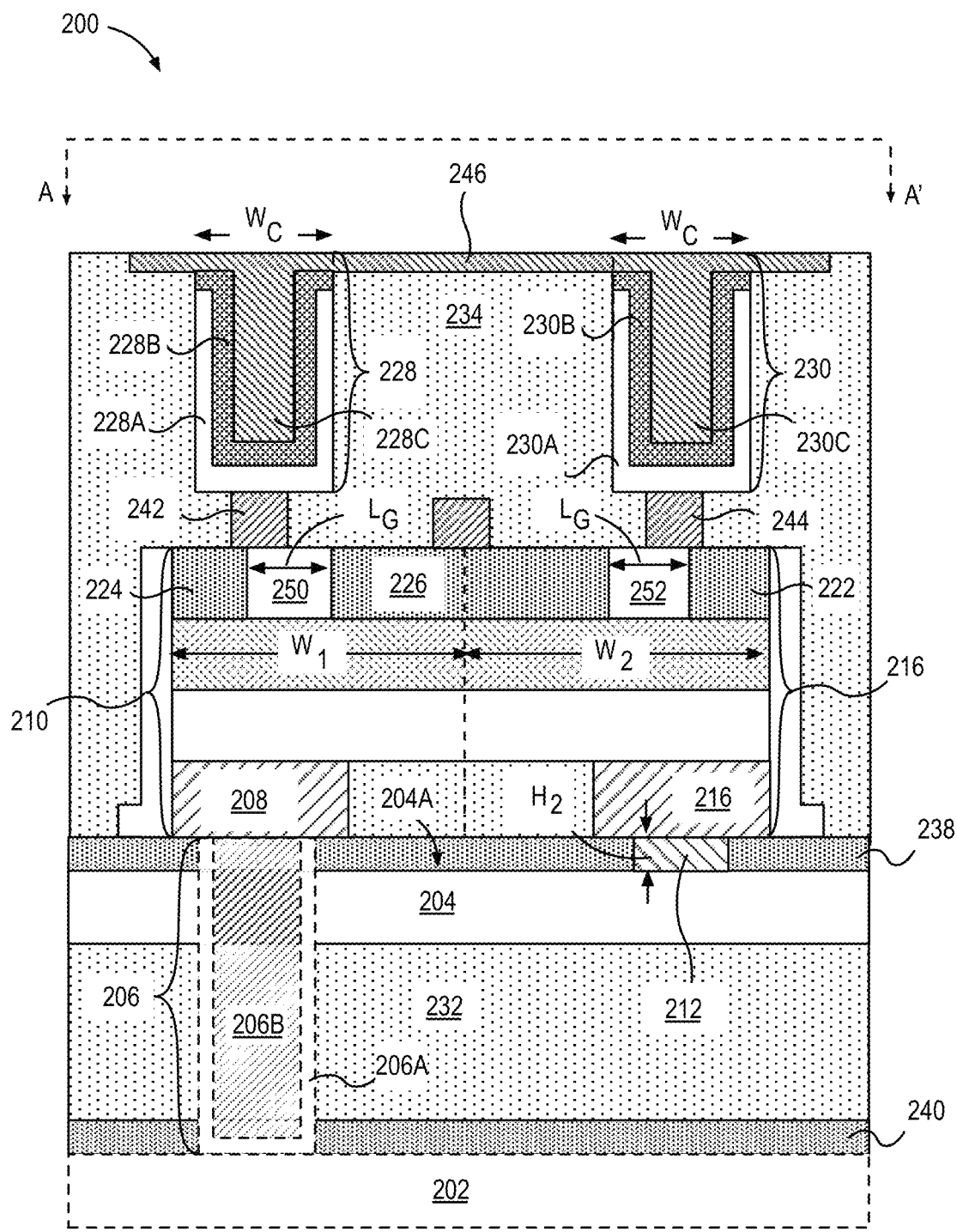
FIG. 2B is a cross-sectional illustration through a longitudinal direction of a word line in the pair of word lines in the structure of FIG. 2A.

FIG. 2B is a cross-sectional illustration along the line A-A' in FIG. 2A. FIG. 2B includes layers that are not illustrated in FIG. 2A such as dielectrics 232 and 234, one or more layers within capacitors 228 and 230, and etch stop layer 238. In embodiments, the capacitors 228 and 230 have one or more features of the capacitors 116 and 120 (described in association with FIG. 1F). Capacitors 228 and 230 are laterally surrounded by dielectric 234. Dielectrics 232 and 234 each include a material that is the same or substantially the same as the material of dielectric 136.

Capacitor 228 includes an electrode 228A, an insulator 228B on and adjacent to electrode 228A, and an electrode 228C on and adjacent to insulator 228B. Capacitor 230 includes an electrode 230A, an insulator 230B on and adjacent to electrode 230A, and an electrode 230C on and adjacent to the insulator 230B. As shown, electrode 228A of capacitor 228 is coupled to terminal 224 through an interconnect 242 and electrode 230A of capacitor 230 is coupled to terminal 222 through an interconnect 244. In the illustrative embodiment, interconnects 242 and 244 have a smaller footprint than capacitors 228 or 230, respectively. In some embodiments, electrodes 228A and 230A include a material that is the same or substantially the same as the material of the electrode 116A (described in association with FIG. 1F). In some embodiments, electrodes 228C and 230C includes a material that is the same or substantially the same as the material of the electrodes 116C (described in association with FIG. 1F). In some embodiments, insulator 228B and 230B includes a material that is the same or substantially the same as the material of the insulator 116B (described in association with FIG. 1F).

In the illustrative embodiment, electrodes 228B and 230B, respectively, are electrically coupled by an electrode 246 that extends between the capacitors of 228 and 230. Electrically coupling electrodes 228B and 230B enables a single programming voltage to be applied on electrode 246. Programming of capacitors 228 and 230 can then be accomplished by individually applying voltages on electrodes 228A and 230A, respectively. In an embodiment, each of the capacitors 228 or 230 have a lateral width $W_C$. In exemplary embodiments, $W_C$ is substantially the same for each capacitor 228 and 230. $W_C$ is less than $W_1$ or $W_2$.

The lateral spacing between terminals 224 and 226, and between 222 and 226 defines a respective gate length, $L_G$, for transistor 210 and 216. In the illustrative embodiment, terminals 224 and 226 are separated by isolation 250, and terminals 222 and 226 are separated by isolation 252 that extend along a length (into the negative x direction) of the transistors 210 and 216, respectively. As shown, the interconnect 242 is partially on the terminal 224 and on the isolation 250. In other embodiments, interconnect 242 is only on the terminal 224. As shown, the interconnect 244 is partially on the terminal 222 and on the isolation 252. In other embodiments, interconnect 244 is only on the terminal 222.

In the illustrative embodiment via 212 is laterally surrounded by etch stop layer 238. In the illustrative embodiment, via 212 and etch stop layer 238 have a substantially same height that is a result of a process flow utilized to fabricate device 200. Via 212 has a height, $H_2$, as measured from an uppermost surface 204A of the word line 204. Via 212 may be substantially confined (along the y-direction) to gate 216 to prevent shorting with gates of adjacent transistors that may be present along the y-direction. In the illustrative embodiment, via 212 is laterally confined within a boundary of gate 216. In the illustrative embodiment, via 206 and word line 202 are superimposed for illustrative purposes. Via 206 and word line 202 are on a different plane.

Figure 2C:
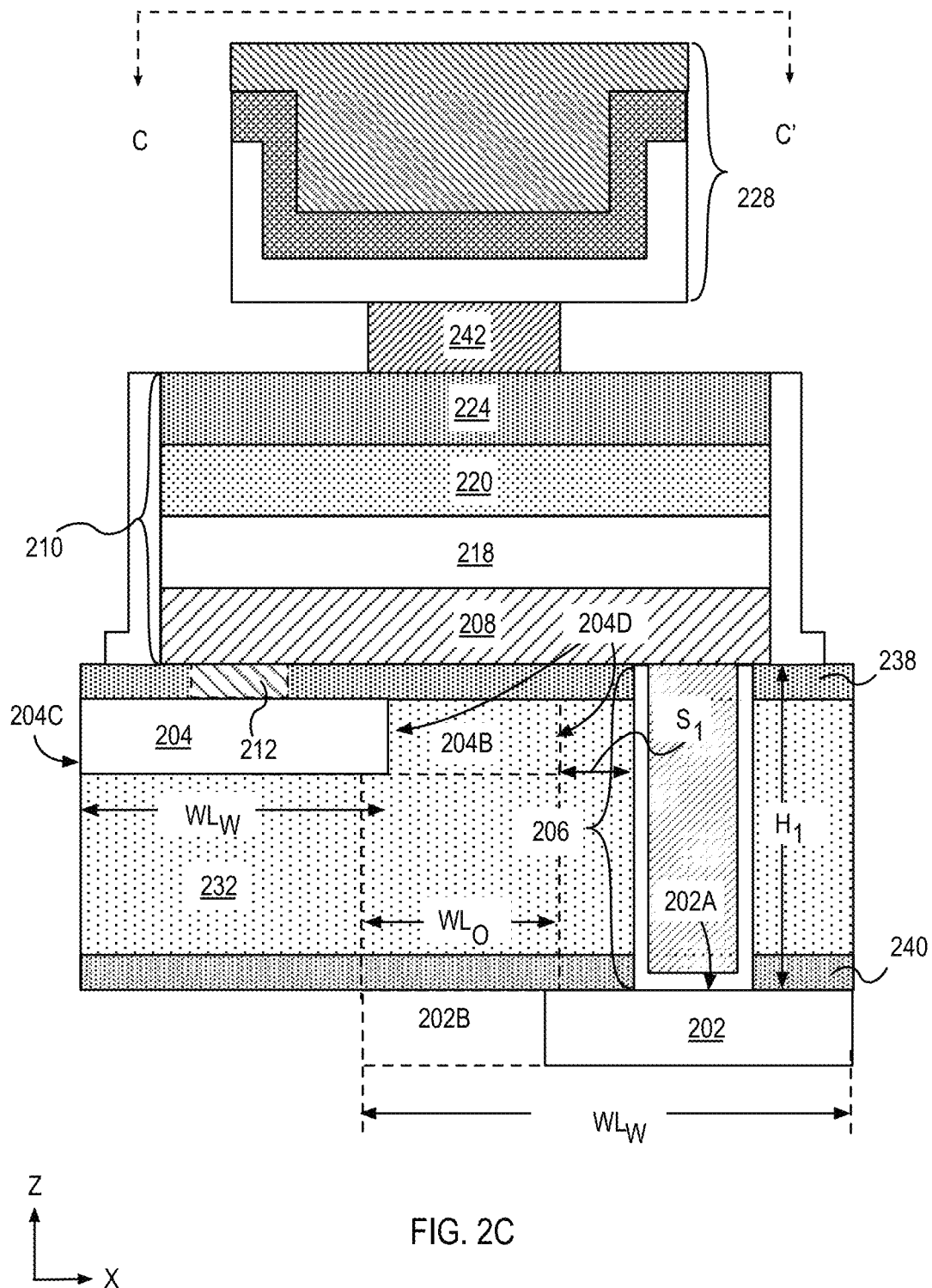
FIG. 2C is a cross-sectional illustration across the pair of word lines and through a single transistor in structure of FIG. 2A.

FIG. 2C is a is a cross-sectional illustration along the line B-B' through the structure in FIG. 2A. FIG. 2C includes layers that are not illustrated in FIG. 2A such as dielectric 232 and etch stop layers 238 and 240. As shown, via 206 extends from an uppermost surface 202A of the word line 202 to the gate 208. Via 206 has a vertical thickness, $H_1$, as measured from an uppermost surface 202A. Via 206 is laterally surrounded by dielectric 232 and etch stop layers 238 and 240. Dielectric 238 and an etch stop layers 238 and 240 include materials that have a low dielectric constant to prevent capacitance build up. Via 206 has one or more features of via 114 (described in association with FIG. 1B). In the illustrative embodiment, via 206 includes a liner layer 206A adjacent to the dielectric 232 and etch stop layers 238 and 240, and a fill metal 206B adjacent to the liner layer 206A. As shown, the liner layer 206A and fill metal 206B are both in contact with the gate 206.

In some embodiments, word lines 202 and 204 can overlap when $L_1$ is reduced, such as is indicated by extensions 202B and 204B within dashed lines. Overlapping between word lines 202 and 204 can enable preserving a low line resistance, such as a line resistance below 5000 Ohm. The overlap, $W_{LO}$, may be also tuned to provide word lines 202 and 204 with a desired range of electrical line resistance. In some embodiments, the overlap, $W_{LO}$, may be between 0-20 nm.

In general, $WL_W$ is substantially the same for each word line 202 and 204. However, Word line 202 may extend laterally under word line 204. In some embodiments, word line 202 may extend laterally beyond a sidewall 204C of the word line 204. However, it is desirable to confine word line 202 to within sidewall 204C to avoid contacting adjacent word lines on level 205A. However, the lateral width, $W_{LW}$ of the upper word line 204 is constrained compared to the lateral width of the lower word line 202 because of the presence of the via 206. As shown, via 206 is laterally distant from sidewall 204D of word line 204 by a spacing $S_1$. In general, the spacing $S_1$ is dependent on a profile of sidewalls of the via 206. In some embodiments, via 206 has a substantially tapered sidewall profile. In some such embodiments $S_1$ is a maximum spacing between via 206 and word line 204, where the maximum spacing, $S_1$, is at a top surface of the wordline 204 and gradually increases towards word line 202. In the illustrative embodiment, via 206 has a substantially vertical sidewall profile, and $S_1$ is substantially fixed. In embodiments, $S_1$ is at least 5 nm. In the illustrative embodiment, via 212 is superimposed for illustrative purposes. Via 212 and via 206 are on different planes.

Figure 3:
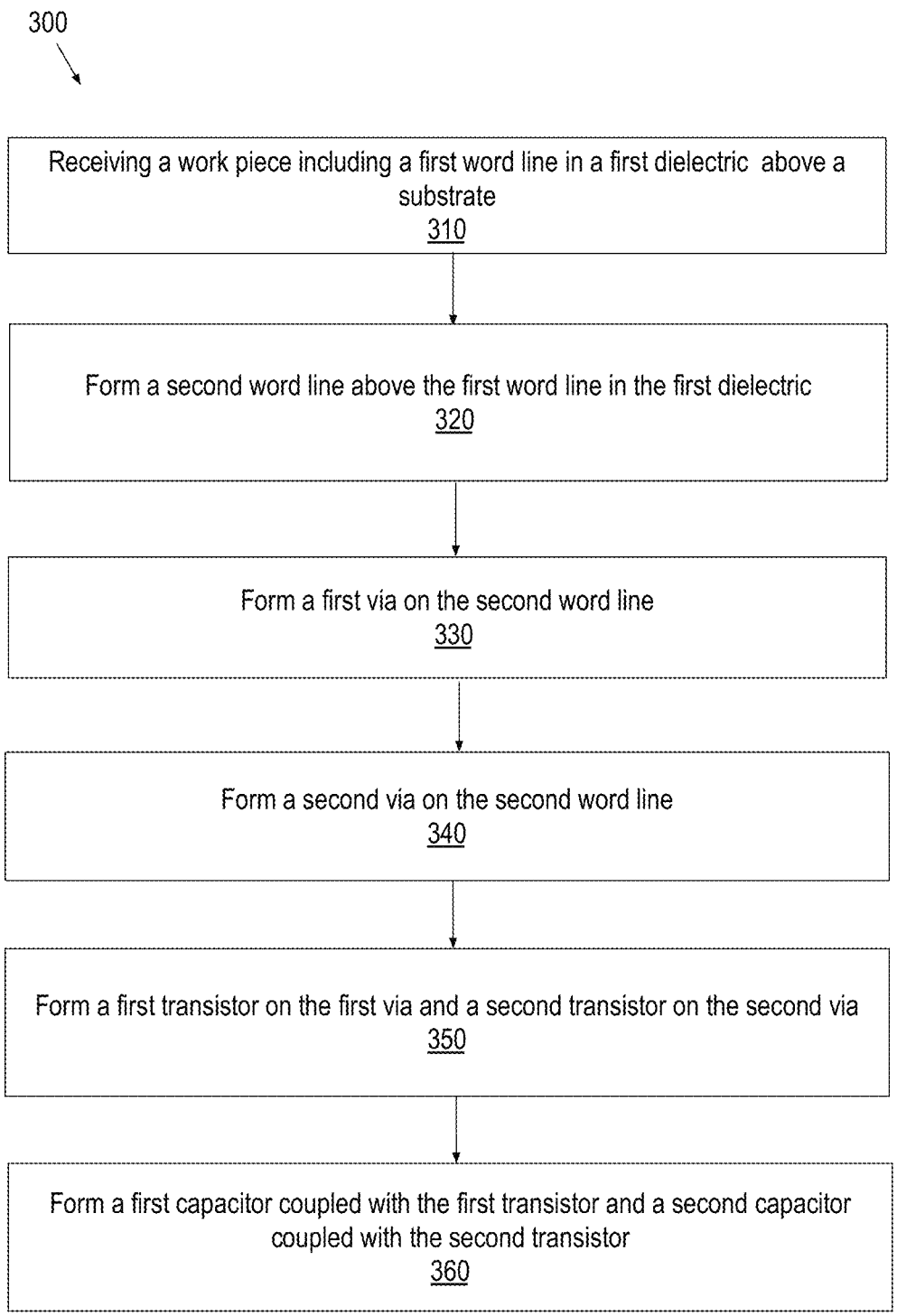
FIG. 3 is a flow diagram illustrating a method to fabricate the device structure in FIG. 1A.

FIG. 3 is a method 300 to fabricate a device structure having word lines on multiple levels coupled with transistors and capacitors, in accordance with an embodiment of the present disclosure. The method 300 begins at operation 310 by receiving a workpiece including a first word line within a first dielectric. The method 300 continues at operation 320 with the process to deposit a first etch stop layer and a second dielectric on the workpiece and following the formation of a second word line within the second dielectric. The method 300 continues at operation 330 with the formation of a first via on the second word line. The method 300 continues at operation 340 with the formation of a second via in the second opening. The method 300 continues at operation 350 with the formation of a first transistor on the first via and a second transistor on a second via. The method 300 concludes at operation 360 with the formation of a first capacitor coupled with the first transistor and a second capacitor coupled with the second transistor.

Figure 4A:
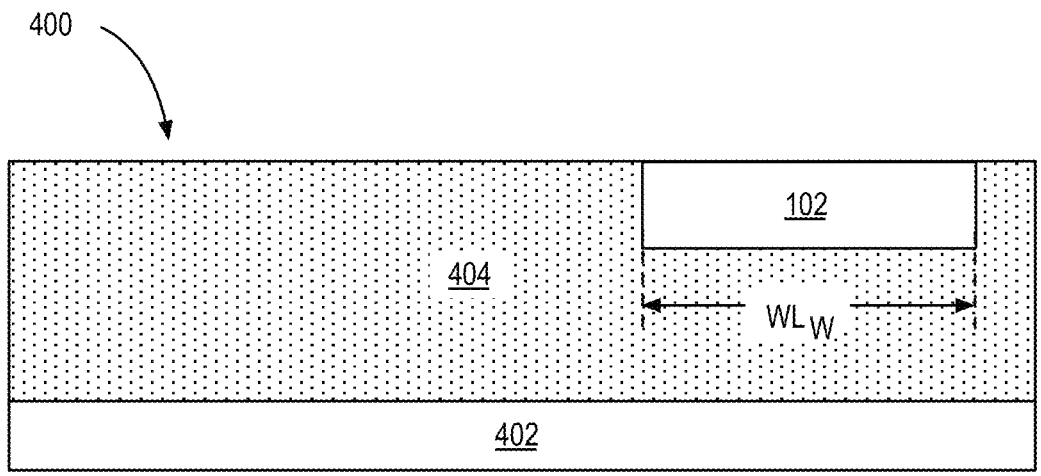
FIG. 4A is a cross-sectional illustration of a workpiece including a first word line fabricated in a first dielectric formed above a substrate, in accordance with an embodiment of the present disclosure.

FIG. 4A is a cross-sectional illustration of a workpiece 400 including a word line 102 fabricated in a dielectric 404, formed above a substrate 402, in accordance with an embodiment of the present disclosure. In an embodiment, the dielectric 404 is blanket deposited by a (PECVD) or a chemical vapor deposition (CVD) process. In an embodiment, the dielectric 404 includes silicon and one or more of nitrogen, oxygen and carbon such as, silicon nitride, silicon dioxide, carbon doped silicon nitride, silicon oxynitride or silicon carbide. In some embodiments, an opening is formed in the dielectric 404 and a conductive material is deposited into the opening. In exemplary embodiments, the conductive material is copper (Cu) which provides much lower resistance compared to other metals such as aluminum, tungsten, titanium. The conductive material is then planarized to form the word line 102. The lateral width, $WL_W$ and vertical thickness, $WL_T$, of the word line 102 is chosen to obtain a requisite line resistance. In some embodiments, metal-diffusion barrier material such as ruthenium, tantalum nitride (TaN), tantalum (Ta), titanium zirconium nitride (e.g., $Ti_xZr_{1-x}N$, such as X=0.53), titanium nitride (e.g., TiN) or titanium tungsten (TiW) is deposited prior to deposition of the conductive material.

Figure 4B:
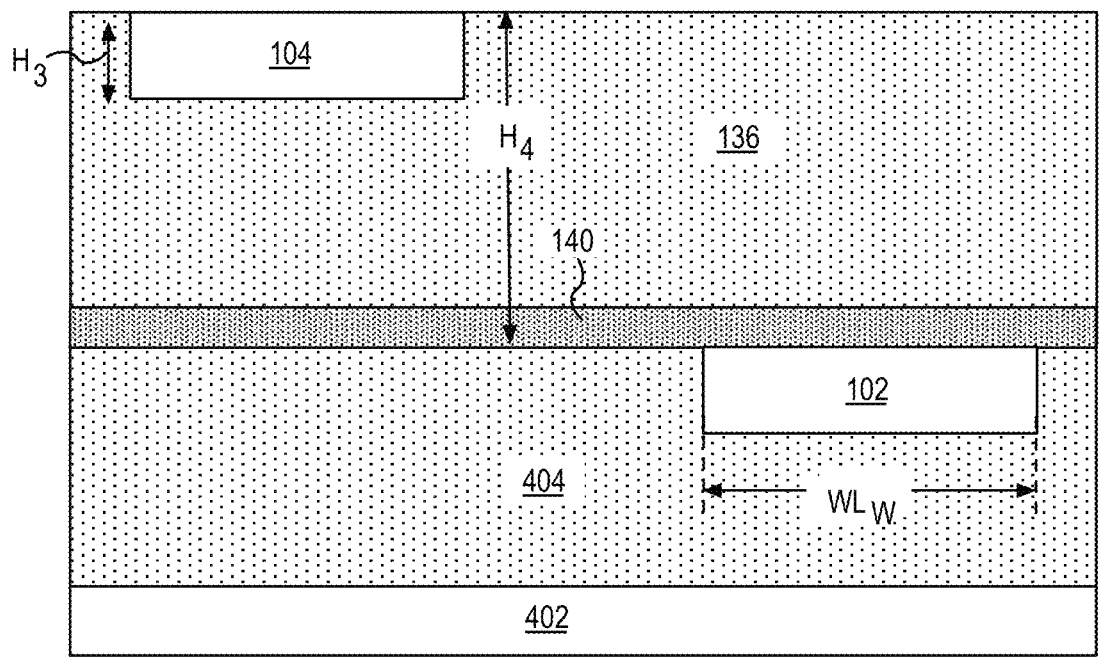
FIG. 4B is a cross-sectional illustration of the structure in FIG. 4A following the formation of a first etch stop layer, a second dielectric on the first etch stop layer and fabrication of a second word line in the second dielectric.

FIG. 4B is a cross-sectional illustration of the structure in FIG. 4A following the formation of etch stop layer 140, a dielectric 136 on the etch stop layer 140 and fabrication of a word line 104 in the dielectric 136. In an embodiment, etch stop layer 140 is blanket deposited on the dielectric 404 and on the word line 102 by a (PECVD) or a chemical vapor deposition (CVD) process. The etch stop layer 140 includes a material that can prevent or help prevent diffusion or migration of copper (Cu) from the word line 102 into the dielectric 136. In exemplary embodiments, etch stop layer 140 includes silicon, nitrogen and one or more of oxygen and carbon. In an embodiment, the dielectric 136 is blanket deposited by a (PECVD) or a chemical vapor deposition (CVD) process. In an embodiment, the dielectric 136 includes silicon and one or more of nitrogen, oxygen and carbon such as, silicon nitride, silicon dioxide, carbon doped silicon nitride, silicon oxynitride or silicon carbide. The etch stop layer 140 and dielectric 136 are deposited to have a combined vertical thickness, $H_4$. $H_4$ may be determined by a desired height of a via to be fabricated above word line 102 and a vertical thickness of word line 104 to be fabricated in the dielectric 136.

In some embodiments, an opening is formed in the dielectric 136 and a conductive material is deposited into the opening. The conductive material is then planarized to form the word line 104. The lateral width, $WL_W$ and vertical thickness, $WL_T$, of the word line is chosen to obtain a requisite line resistance in the word line 104. The word line 104 includes a material that is the same or substantially the same as the material of the word line 102 and may be fabricated in the same or substantially the same manner as word line 102.

Figure 4C:
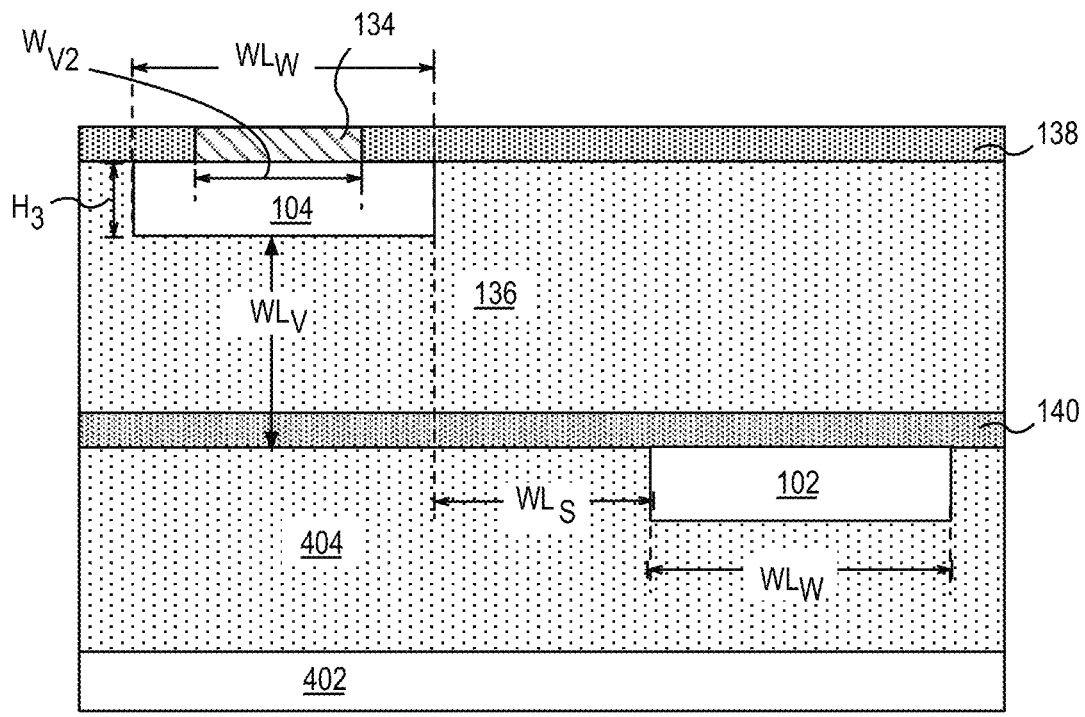
FIG. 4C is a cross-sectional illustration of the structure in FIG. 4B following the process to deposit a second etch stop layer on the second word line and following the process to form a first via on the second word line.

FIG. 4C is a cross-sectional illustration of the structure in FIG. 4B following the process to deposit an etch stop layer 138 on the word line 104 and following the process to form a via 134 on the word line 104.

In an embodiment, etch stop layer 138 may be deposited to a thickness that is favorable for forming a via on the word line 104. The etch stop layer 138 includes a material that is the same or substantially the same as the material of the etch stop layer 140 and has one or more properties of etch stop layer 136. The etch stop layer 136 includes a material that can prevent or help prevent diffusion or migration of copper (Cu) from the word line 104 towards transistors to be fabricated above the via 134.

In an embodiment, an opening is formed in the etch stop layer 138. As shown the opening has a lateral width, $W_{V2}$. In an exemplary embodiment, $W_{V2}$ is less than $WL_W$ of word line 104. After formation of the opening a conductive material is deposited into the opening on the word line 104 and on uppermost surface of the etch stop layer 138. The excess etch stop layer material above the etch stop layer 138 may be removed via a planarization process. In an embodiment, a chemical mechanical planarization (CMP) process may be utilized to isolate and form via 134.

Figure 4D:
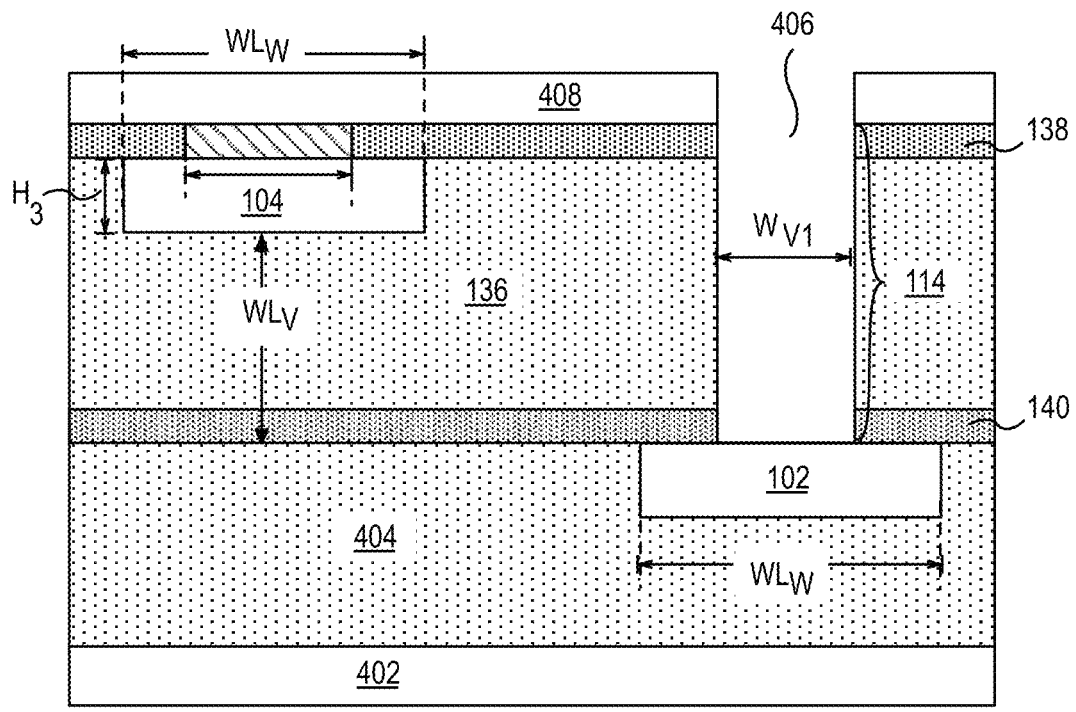
FIG. 4D is a cross-sectional illustration of the structure in FIG. 4C following the process to form an opening in a portion of the second etch stop layer, in the second dielectric and in the first etch stop layer to expose a portion of the first word line.

FIG. 4D is a cross-sectional illustration of the structure in FIG. 4C following the process to form an opening 406 in a portion of the etch stop layer 138 and in the dielectric 136 to expose a portion of the word line 102. In an embodiment, a mask 408 is formed on the dielectric 136 and on the via 134. A plasma etch process may be utilized to form the opening 406 by etching the etch stop layer 138 and dielectric 140 until a portion of the word line 102 is exposed as shown. The profile of the opening 406 may be tapered or substantially vertical as shown. The opening 406 has a width $W_{V1}$, that is less than $WL_W$ of word line 102. In some embodiments, where the mask 408 includes a photoresist material that is lithographically patterned, the mask 408 is removed after the etch process.

Figure 4E:
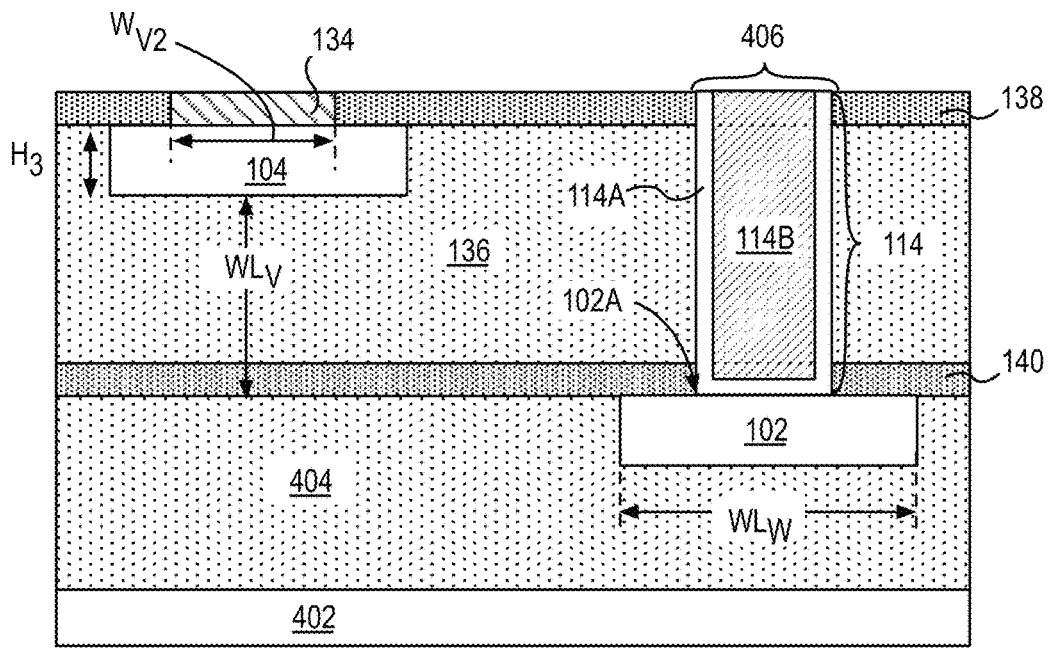
FIG. 4E is a cross-sectional illustration of the structure in FIG. 4D following the process to form a second via in the opening.

FIG. 4E is a cross-sectional illustration of the structure in FIG. 4D following the process to form a via 114 in the opening. In an embodiment, a barrier layer 114A is deposited into the opening 408 on the word line 102, on the etch stop layer 138 and on the via 134. A conductive fill metal 114B is deposited on the surface of the barrier layer 114A, filling the opening 406 The barrier layer 114A may facilitate adhesion for the conductive fill metal 114B. In embodiments, the barrier layer includes a material such as ruthenium, tantalum nitride (TaN), tantalum (Ta), titanium zirconium nitride (e.g., $Ti_xZr_{1-x}N$, such as X=0.53), titanium nitride (e.g., TiN) or titanium tungsten (TiW). In exemplary embodiments, the fill metal can include a material such as tungsten or cobalt.

Figure 4F:
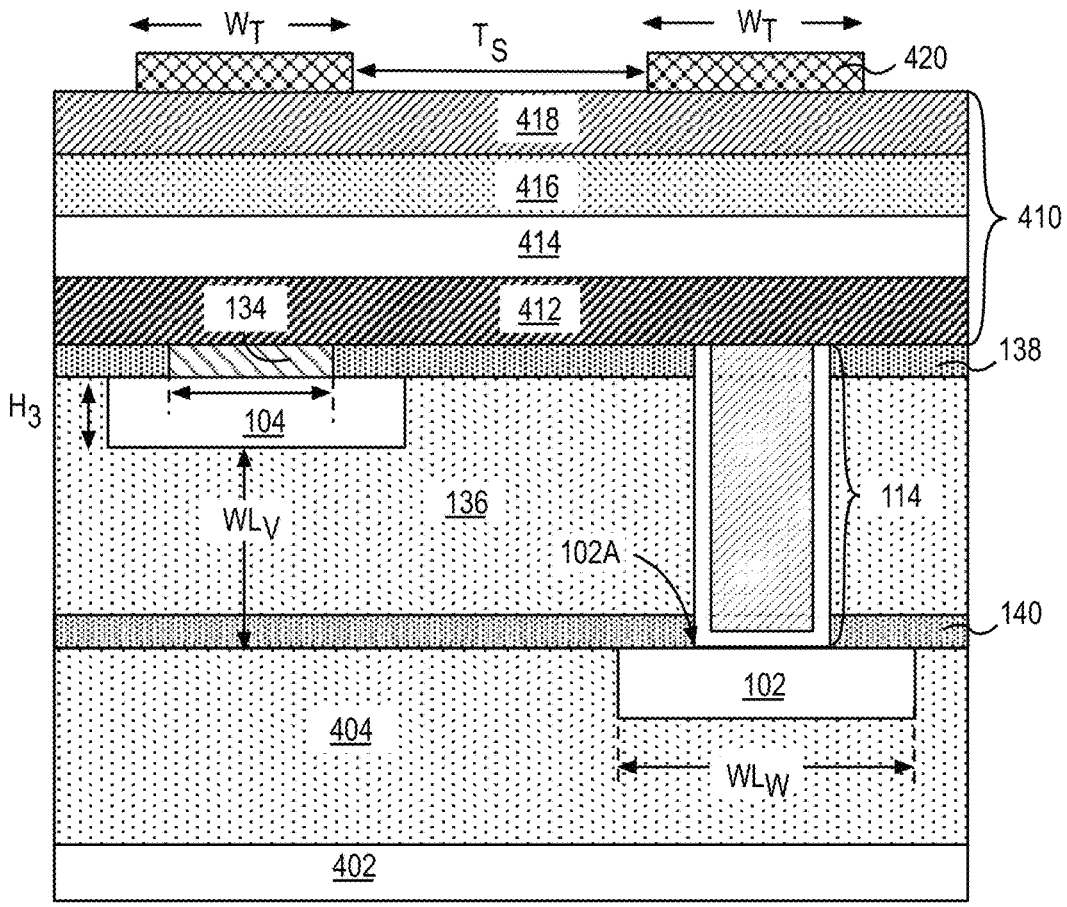
FIG. 4F is a cross-sectional illustration of the structure in FIG. 4E following the process to deposit a material layer stack to fabricate a pair of transistors.

FIG. 4F is a cross-sectional illustration of the structure in FIG. 4E following the process to deposit a material layer stack 410 to fabricate a pair of transistors. In an embodiment, forming the material layer stack 410 includes sequentially depositing individual layers. In an embodiment, a gate electrode material 412 is blanket deposited on vias 134 and 114 and on etch stop layer 138. A gate dielectric layer 414 is deposited on the gate electrode material 412 and a channel material 416 is deposited on the gate dielectric layer 414. In the illustrative embodiment, a conductive material 418 is deposited on the channel material 416. Conductive material 418 is patterned in a downstream operation to provide a source or a drain. In an embodiment, the gate electrode material 412 is blanket deposited by a PVD or a PECVD or an ALD process. In exemplary embodiments, gate electrode material 412 includes a material that is the same or substantially the same as the material of the gate 110 or 112. In an embodiment, the gate dielectric layer 414 is deposited by an ALD process. In exemplary embodiments, gate dielectric layer 414 includes a material that is the same or substantially the same as the material of the gate dielectric layer 162A or 162B. In an embodiment, the channel material 416 is deposited on the gate dielectric layer 414 by a PVD or a PECVD process. In embodiments, channel material 416 includes a material that is the same or substantially the same as the material of the channel layer 164A or 164B. In an embodiment, the conductive material 418 is deposited by a PVD or a PECVD process. In exemplary embodiments, conductive material 418 includes a material that is the same or substantially the same as the material of the source 118 or drain 126.

In an embodiment, a mask 420 is formed on the conductive layer 418. The mask 420 may be lithographically patterned or may include a dielectric material. The mask 420 defines a location where transistors are formed above each via 134 and 114. The mask 420 also defines the lateral width, $W_T$ of transistors to be formed and a space, $T_S$, between two adjacent transistors.

In some embodiments, the conductive material may be deposited by a damascene process after patterning of the channel material 416, gate dielectric layer 414 and the gate electrode material 412.

Figure 5A:
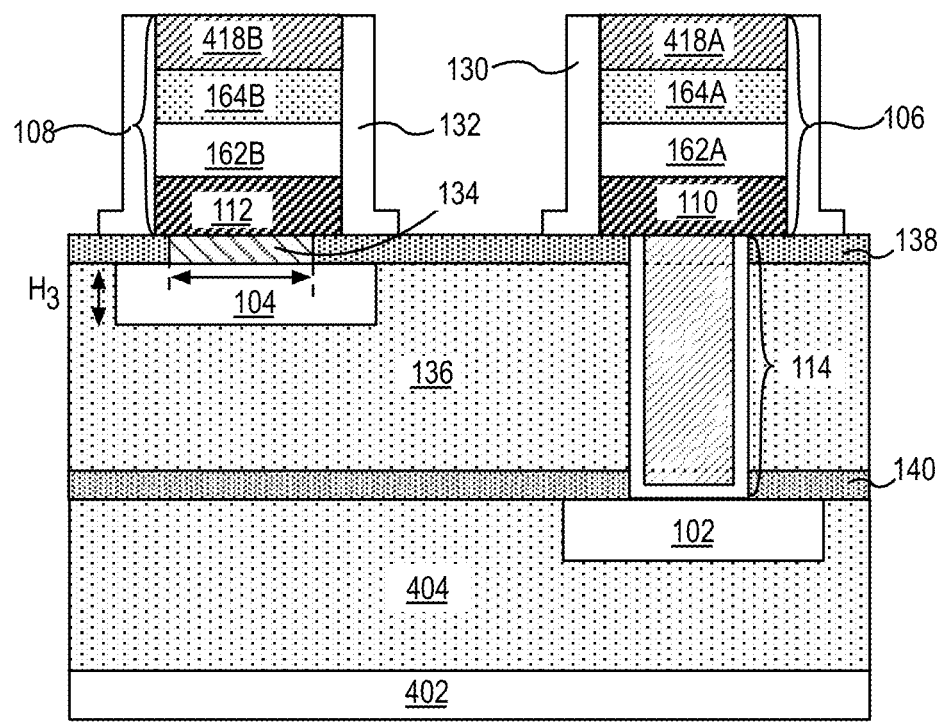
FIG. 5A is a cross-sectional illustration of the structure in FIG. 4F following the process to form a first transistor on the second via and a second transistor on the first via, in accordance with an embodiment of the present disclosure.

FIG. 5A is a cross-sectional illustration of the structure in FIG. 4F following the process to form a transistor 106 on the via 114 and a transistor 108 on the via 134. The material layer stack 410 (described in association with FIG. 4F) is patterned to form transistors 106. In an embodiment, a plasma etch process is utilized to etch the material layer stack 410 and form gate electrode 110, gate dielectric layer 162A and channel layer 164A in transistor 106, and gate electrode 112, gate dielectric layer 162B and channel layer 164B in transistor 108. The conductive material portions 418A and 418B are also formed by patterning conductive material 418, where each of the conductive material portions 418A and 418B have a same or substantially the same footprint as the channel layer 164A or 164B.

As shown a spacer 130 is formed laterally adjacent to sidewalls of transistor 106 and a spacer 132 is formed laterally adjacent to sidewalls of the transistor 108 after patterning. The spacers 130 and 132 laterally surround the transistors 106 and 108, respectively as shown in the plan-view illustration of FIG. 5B.

Figure 5B:
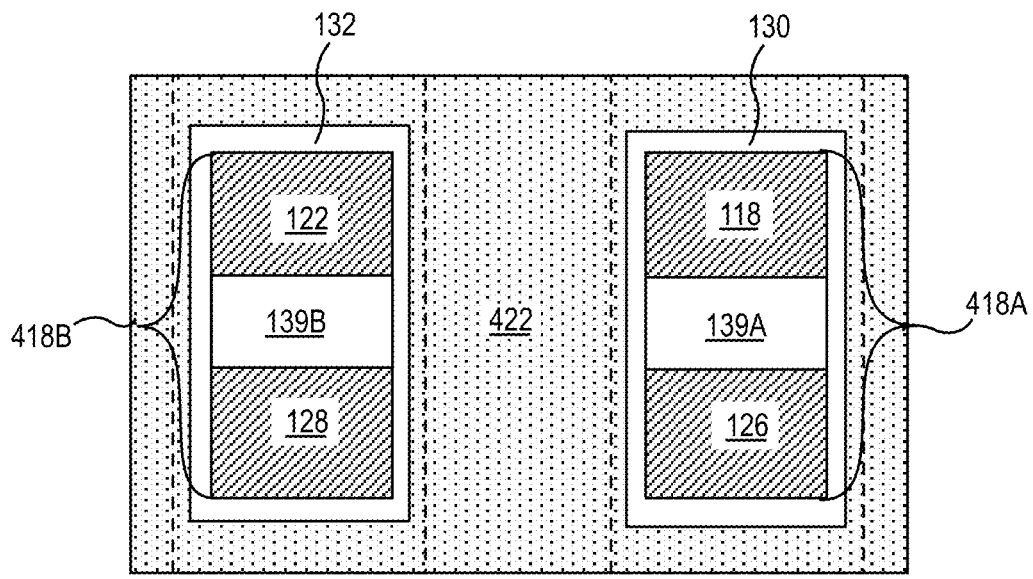
FIG. 5B is a plan-view illustration of the structure of FIG. 5A following the formation of source and drain terminals in each of the first and the second transistors.

FIG. 5B is a plan-view illustration of the structure of FIG. 5A following the formation of source and drain terminals in each of the transistors 106 and 108. In an embodiment, a dielectric 422 is deposited on the structure of FIG. 5A and planarized. In some embodiments, a mask is formed that defines an opening above the conductive material portions 418A and 418B. The conductive material portions 418A and 418B may be etched to expose channel layers 164A and 164B (not visible in the illustration). The etch forms terminals 118, 122 126 and 128. In the illustrative embodiment, a dielectric material is then deposited blanket deposited and planarized to form isolation 139A between terminals 118 and 126 and isolation 139B between terminals 122 and 126.

Figure 6A:
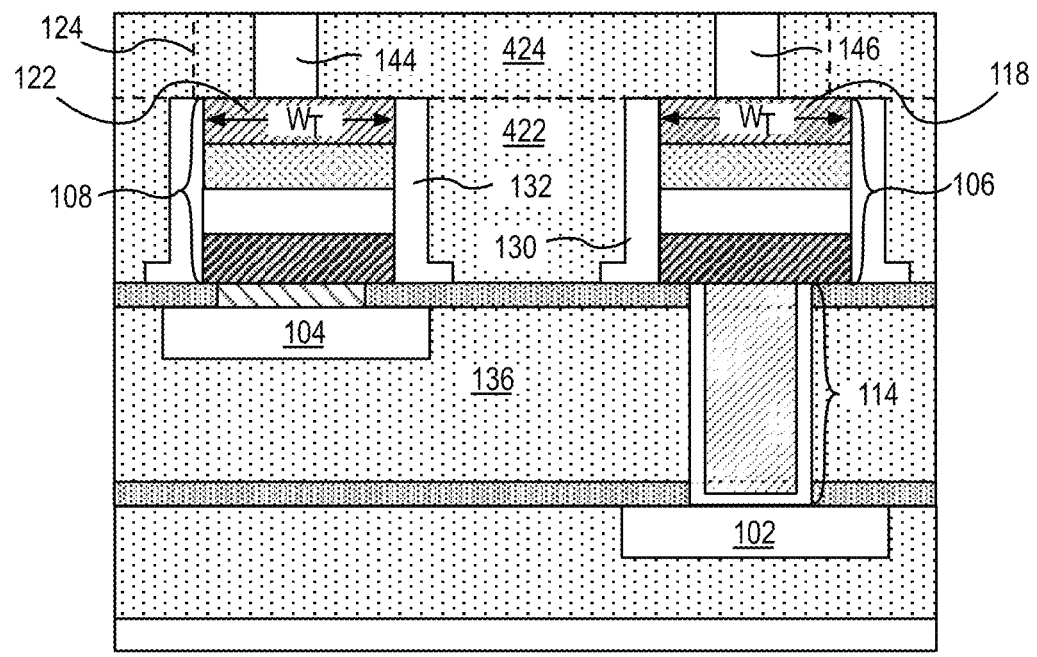
FIG. 6A is a cross-sectional illustration of the structure in FIG. 5A following the process to fabricate a spacer laterally adjacent to the first and second transistors, a third dielectric therebetween, a first interconnect on the first transistor and a second interconnect on the second transistor, in accordance with an embodiment of the present disclosure.

FIG. 6A is a cross-sectional illustration of the structure in FIG. 5A following the process to fabricate an interconnect 144 on the transistor 108 and an interconnect 146 on the transistor 106. In an embodiment, a dielectric 424 is deposited on the transistors 106 and 108 and on the dielectric 422. The dielectric 424 is then patterned to form openings above the terminals 118 and 122. In some embodiments, dielectric 424 includes a material that is the same or substantially the same as the material of the dielectric 422. In the illustrative embodiment, a conductive material is deposited into the openings and planarized to form interconnects 144 and 146. The interconnects may be wider or narrower compared to $W_T$. As shown the interconnects have a lateral width that is less than $W_T$.

While not on the plane of FIG. 6A, an interconnect line structure such as line structure 124 (indicated by dashed line) is fabricated connecting terminals on transistors 106 and 108. The terminals are on a same plane as the plane of the interconnect structure 124. In an embodiment, interconnect line structure 124 is also formed by a damascene process.

Figure 6B:
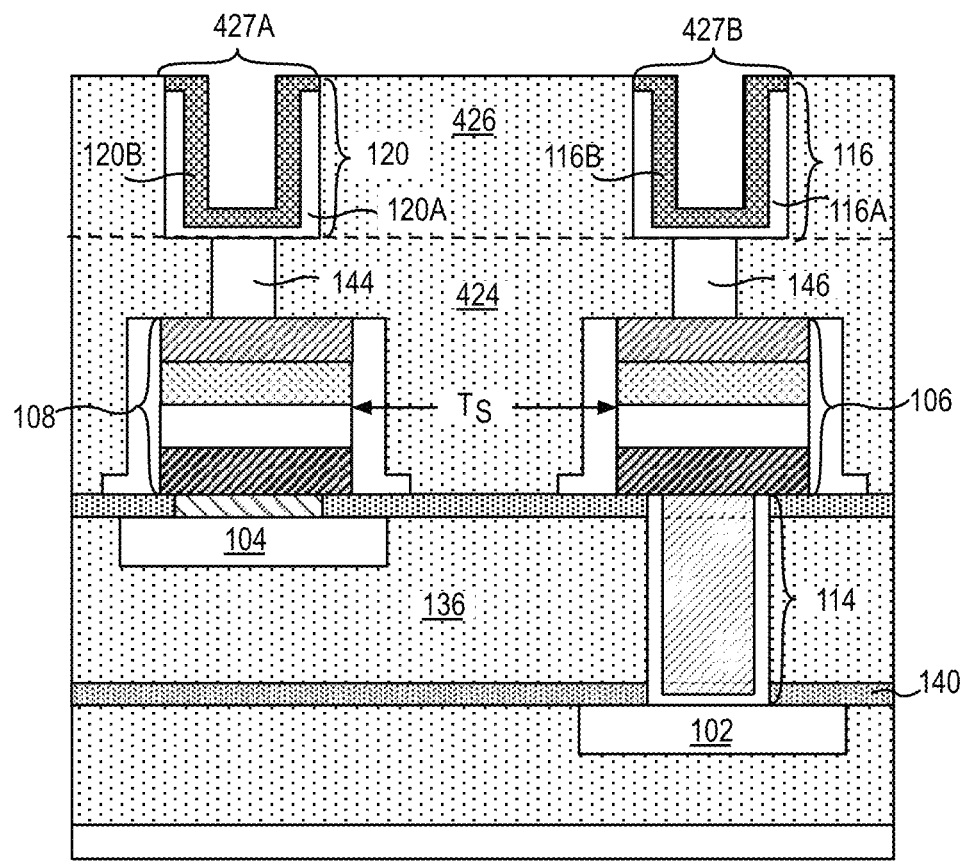
FIG. 6B is a cross-sectional illustration of the structure in FIG. 6A following the process to deposit a fourth dielectric on the third dielectric and on the first and on the second interconnects and fabricate portions of a first capacitor on the first interconnect and fabricate portions of a second capacitor on the second interconnect.

FIG. 6B is a cross-sectional illustration of the structure in FIG. 6A following the process to deposit a dielectric 426 on the dielectric 424 and on the interconnects 144 and 146, and portions of a respective capacitor in each of openings 427A and 427B. In some embodiments, dielectric 426 includes a material that is the same or substantially the same as the material of the dielectric 424 and is deposited by a PECVD, CVD or a PVD process. In an embodiment, openings 427A and 427B are formed in the dielectric 426 to expose interconnects 144 and 146, respectively. The openings 427A and 427B may be formed by a plasma etch process.

Fabrication of capacitor 116 and 120 includes deposition of an electrode material in the openings formed in the dielectric 426. The electrode material is deposited and maybe patterned to form electrodes 116A and 120A. In the illustrative embodiment, the electrodes 116A and 120A are recessed below an uppermost surface of the dielectric 426 during the patterning process. An insulator layer is deposited on the electrodes 116A and 120A. The insulator layer may be patterned or removed from above the dielectric 426 by a planarization process to form insulator 116B and 120B.

Figure 6C:
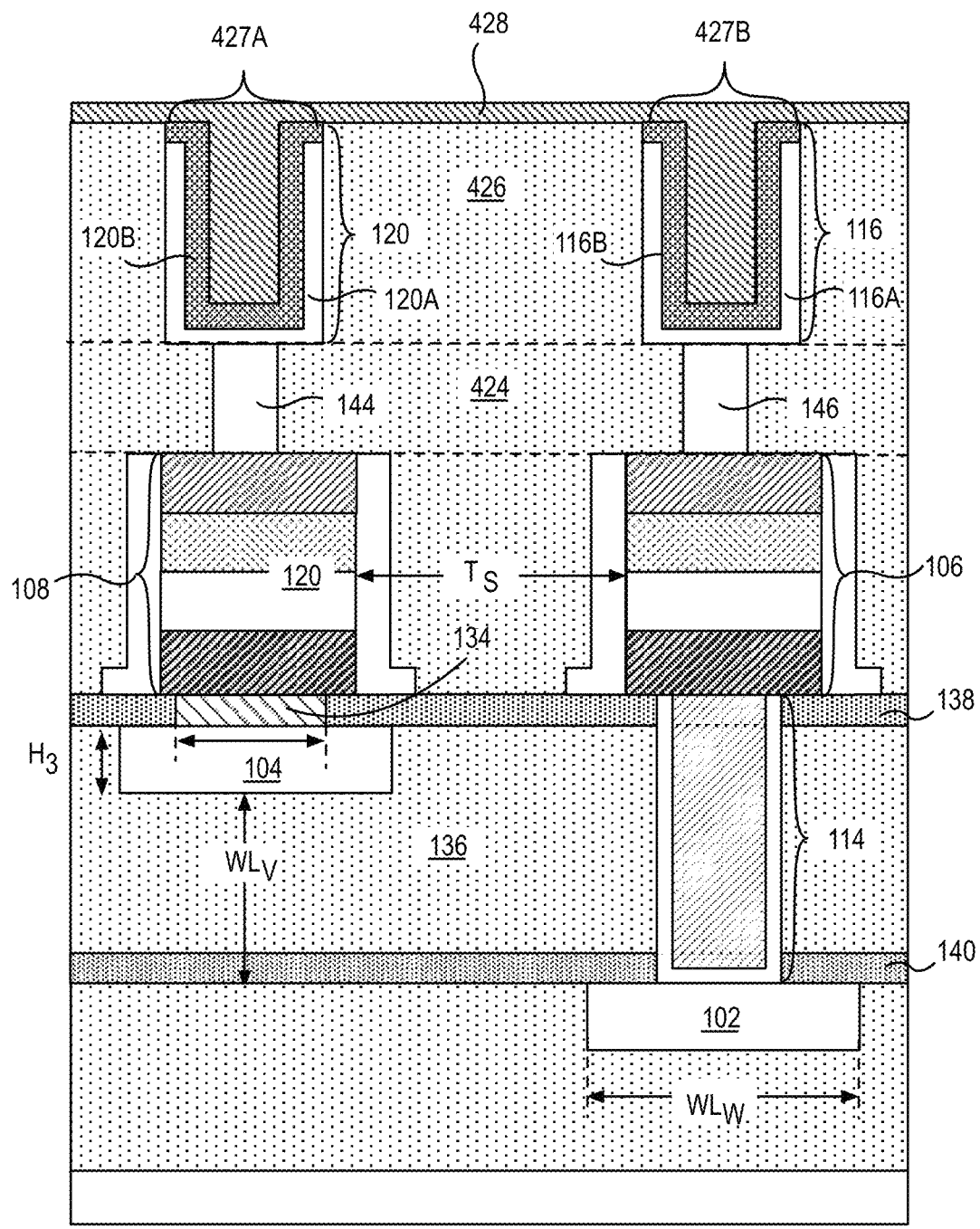
FIG. 6C is a cross-sectional illustration of the structure in FIG. 6B following the process to deposit an electrode material.

FIG. 6C is a cross-sectional illustration of the structure in FIG. 6B following the process to deposit an electrode material 428 on the insulator 116B and 120B and on the dielectric 426. In an embodiment, the electrode material 428 is blanket deposited into the openings 427A and 427B and planarized. In some embodiments, a CMP process may be utilized to planarize the electrode material 428.

Figure 7A:
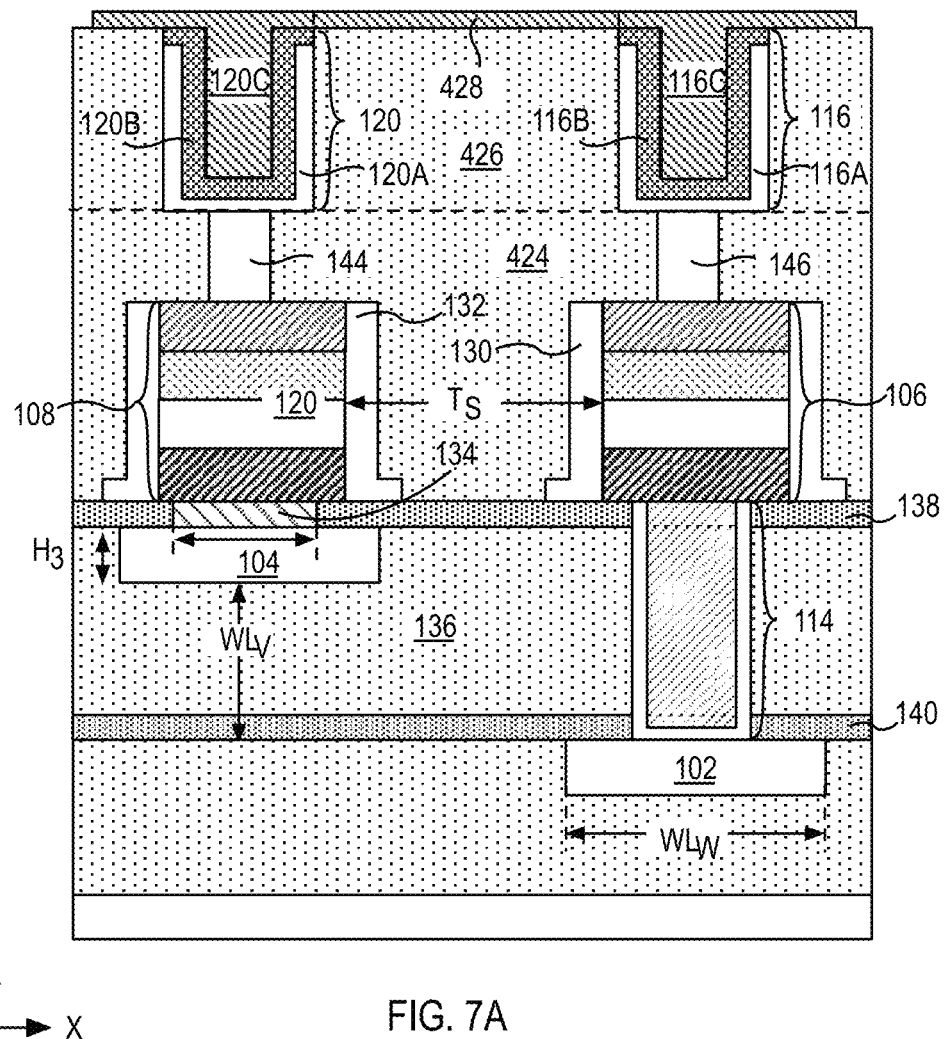
FIG. 7A is a cross-sectional illustration of the structure in FIG. 6C following the process to pattern the electrode to form the first and the second capacitor.

FIG. 7A is a cross-sectional illustration of the structure in FIG. 6C following the process to pattern the electrode. In an embodiment, a mask is formed on the electrode material 428. The mask may be designed to form individual capacitors 116 and 120. In the illustrative embodiment, the mask includes a bridging portion between capacitors 116 and 120. In an embodiment, a plasma etch process is utilized to etch the electrode material 428 to form electrodes 116C and 120C and a bridging plate 148 connecting electrodes 116C and 120C.

Figure 7B:
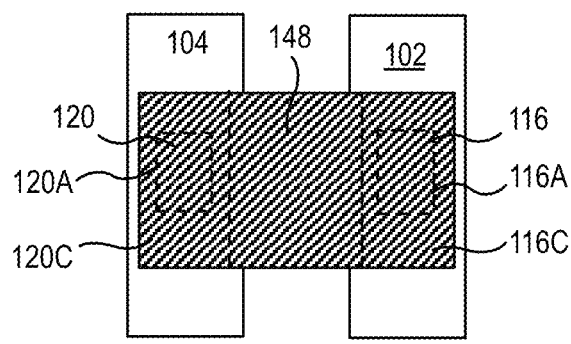
FIG. 7B is a plan view of the structure in FIG. 7A.

FIG. 7B is a plan view of the structure in FIG. 7A. As shown, electrodes 116C and 120C are connected by a bridging plate 148. In the illustrative embodiment, electrodes 116C and 120C laterally extend, in both x and y directions, beyond external sidewalls of electrodes 116A and 120A. While bridging plate 148 facilitates voltage to be applied simultaneously to electrodes 116C and 120C, capacitors 116 and 120 can be programmed independently.

While two transistor capacitor pairs have been discussed with respect to FIGS. 4A-7B. The process described can be extended to apply to formation of a large array of transistor capacitor pairs.

Figure 8:
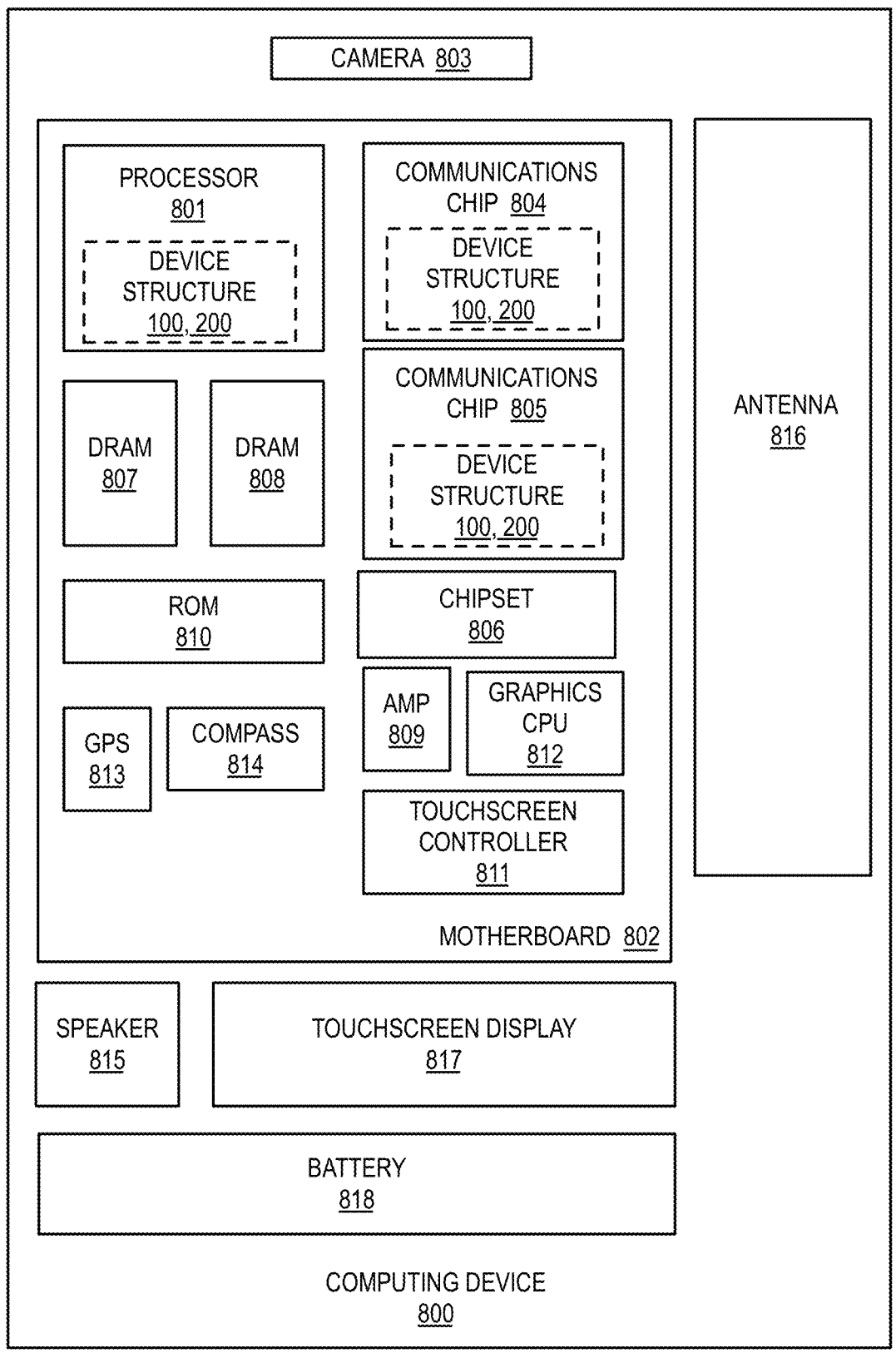
FIG. 8 illustrates a computing device in accordance with embodiments of the present disclosure.

FIG. 8 illustrates a computing device 800 in accordance with embodiments of the present disclosure. As shown, computing device 800 houses a motherboard 802. Motherboard 802 may include a number of components, including but not limited to a processor 801 and at least one communications chip 804 or 805. Processor 801 is physically and electrically coupled to the motherboard 802. In some implementations, communications chip 805 is also physically and electrically coupled to motherboard 802. In further implementations, communications chip 805 is part of processor 801.

Depending on its applications, computing device 800 may include other components that may or may not be physically and electrically coupled to motherboard 802. These other components include, but are not limited to, volatile memory (e.g., DRAM), non-volatile memory (e.g., ROM), flash memory, a graphics processor, a digital signal processor, a crypto processor, a chipset 806, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

Communications chip 805 enables wireless communications for the transfer of data to and from computing device 800. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communications chip 805 may implement any of a number of wireless standards or protocols, including but not limited to Wi-Fi (IEEE 801.11 family), WiMAX (IEEE 801.11 family), long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. Computing device 800 may include a plurality of communications chips 804 and 805. For instance, a first communications chip 805 may be dedicated to shorter range wireless communications such as Wi-Fi and Bluetooth and a second communications chip 804 may be dedicated to longer range wireless communications such as GPS, EDGE, GPRS, CDMA, WiMAX, LTE, Ev-DO, and others.

Processor 801 of the computing device 800 includes an integrated circuit die packaged within processor 801. In some embodiments, the integrated circuit die of processor 801 includes one or more interconnect structures, volatile memory devices, non-volatile memory devices, and device structures such as device structures 100 or 200 described in association with FIGS. 1A-1F and 2A-2C, respectively. Referring again to FIG. 8, the term "processor" may refer to any device or portion of a device that processes electronic data from registers and/or memory to transform that electronic data into other electronic data that may be stored in registers and/or memory.

Communications chip 805 also includes an integrated circuit die packaged within communication chip 805. In another embodiment, the integrated circuit die of communications chips 804, 805 includes one or more interconnect structures, non-volatile memory devices and transistor coupled with capacitors. Depending on its applications, computing device 800 may include other components that may or may not be physically and electrically coupled to motherboard 802. These other components may include, but are not limited to, volatile memory (e.g., DRAM) 807, 808, non-volatile memory (e.g., ROM) 810, a graphics CPU 812, flash memory, global positioning system (GPS) device 813, compass 814, a chipset 806, an antenna 816, a power amplifier 809, a touchscreen controller 811, a touchscreen display 817, a speaker 815, a camera 803, and a battery 818, as illustrated, and other components such as a digital signal processor, a crypto processor, an audio codec, a video codec, an accelerometer, a gyroscope, and a mass storage device (such as hard disk drive, solid state drive (SSD), compact disk (CD), digital versatile disk (DVD), and so forth), or the like. In further embodiments, any component housed within computing device 800 and discussed above may contain a stand-alone integrated circuit memory die that includes one or more arrays of nonvolatile memory devices.

In various implementations, the computing device 800 may be a laptop, a netbook, a notebook, an Ultrabook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder. In further implementations, the computing device 800 may be any other electronic device that processes data.

Figure 9:
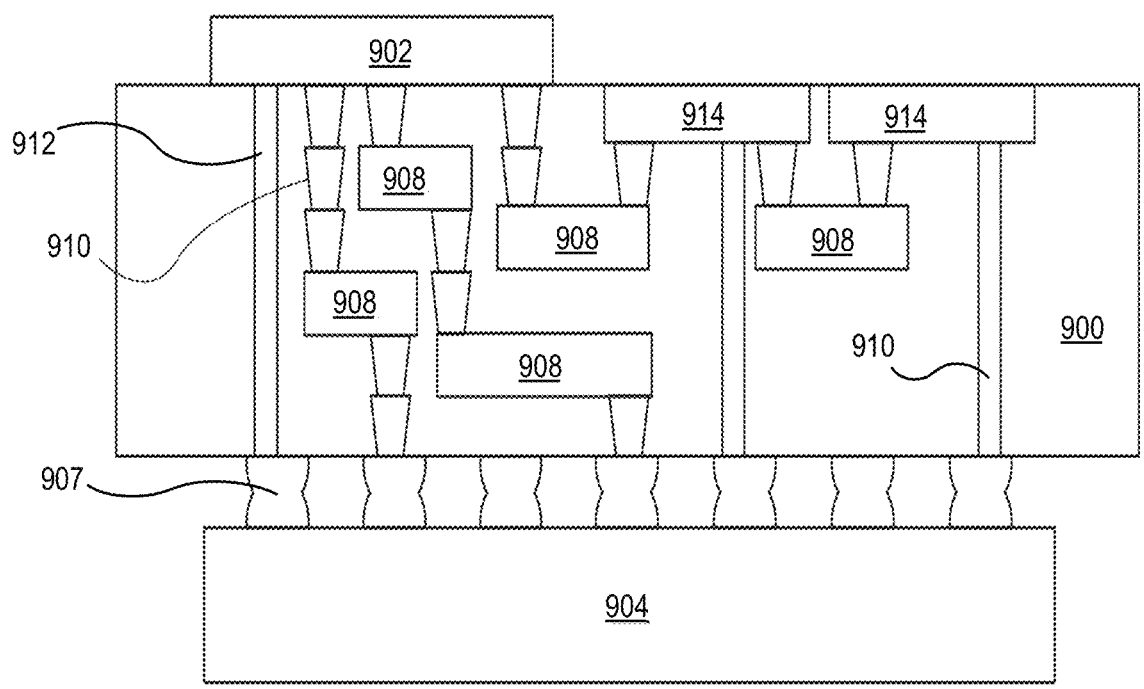
FIG. 9 illustrates an integrated circuit (IC) structure.

FIG. 9 illustrates an integrated circuit (IC) structure 900 that includes one or more embodiments of the disclosure. The integrated circuit (IC) structure 900 is an intervening substrate used to bridge a first substrate 902 to a second substrate 904. The first substrate 902 may be, for instance, an integrated circuit die. The second substrate 904 may be, for instance, a memory module, a computer mother, or another integrated circuit die. Generally, the purpose of an integrated circuit (IC) structure 900 is to spread a connection to a wider pitch or to reroute a connection to a different connection. For example, an integrated circuit (IC) structure 900 may couple an integrated circuit die to a ball grid array (BGA) 907 that can subsequently be coupled to the second substrate 904. In some embodiments, the first substrate 902 and the second substrate 904 are attached to opposing sides of the integrated circuit (IC) structure 900. In other embodiments, the first substrate 902 and the second substrate 904 are attached to the same side of the integrated circuit (IC) structure 900. And in further embodiments, three or more substrates are interconnected by way of the integrated circuit (IC) structure 900.

The integrated circuit (IC) structure 900 may be formed of an epoxy resin, a fiberglass-reinforced epoxy resin, a ceramic material, or a polymer material such as polyimide. In further implementations, the integrated circuit (IC) structure may be formed of alternate rigid or flexible materials that may include the same materials described above for use in a semiconductor substrate, such as silicon, germanium, and other group III-V and group IV materials.

The integrated circuit (IC) structure may include metal interconnects 908 and vias 910, including but not limited to through-silicon vias (TSVs) 912. The integrated circuit (IC) structure 900 may further include embedded devices 914, including both passive and active devices. Such embedded devices 914 include capacitors, resistors, inductors, fuses, diodes, transformers, device structure including transistors, such as device structures 100 or 200 described in association with FIGS. 1A-1F and 2A-2D, respectively. Referring again to FIG. 9, the integrated circuit (IC) structure 900 may further include embedded devices 914 such as one or more resistive random-access devices, sensors, and electrostatic discharge (ESD) devices. More complex devices such as radiofrequency (RF) devices, power amplifiers, power management devices, antennas, arrays, sensors, and MEMS devices may also be formed on the integrated circuit (IC) structure 900.

Example 1: The device structure includes a first interconnect line along a longitudinal direction where the first interconnect line is within a first metallization level, a second interconnect line parallel to the first interconnect line, where the second interconnect line is within a second metallization level. The device structure further includes a first transistor and a second transistor on a same plane, where the second transistor is laterally separated from the first transistor, where a gate of the first transistor is coupled to the first interconnect line and where a gate of the second transistor is coupled to the second interconnect line. There is a via between the first interconnect line and the gate of the first transistor. The device structure further includes a first capacitor coupled to a first terminal of the first transistor and a second capacitor coupled to a first terminal of the second transistor. A third interconnect line couples a second terminal of the first transistor with a second terminal of the second transistor, where the second interconnect line extends along a direction orthogonal to the longitudinal direction.

Example 2: The device structure according to example 1, where the second interconnect line is laterally separated from the first interconnect line by a first distance and the second transistor is laterally separated from the first transistor by a second distance.

Example 3: The device structure according to any of one examples 1 through 2, where the first distance is less than the second distance.

Example 4: The device structure according to any of one examples 1 through 3, where the first distance is zero.

Example 5: The device structure according to any of one examples 1 through 4, where the first interconnect line laterally overlaps the second interconnect line.

Example 6: The device structure according to any of one examples 1 through 5, where the via is a first via and the device structure further includes a second via coupled directly between the second interconnect line and the gate of the second transistor.

Example 7: The device structure according to any of one examples 1 through 6, where the first interconnect line is separated from the second interconnect line by a first vertical thickness measured along a second direction orthogonal to the first and the longitudinal directions, where the second interconnect line has a second vertical thickness measured along the second direction, where the metallization structure has a third vertical thickness measured along the second direction, where the via has a fourth vertical thickness measured along the second direction, and where the fourth vertical thickness is substantially equal to a sum of the first, the second and the third vertical thicknesses.

Example 8: The device structure according to any of one examples 1 through 7, where the first interconnect line and the second interconnect line each have a respective first lateral width as measured along a third direction orthogonal to the longitudinal direction, and where the first transistor and the second transistor each have a respective second lateral width as measured along the third direction and where the first lateral width is greater than the second lateral width.

Example 9: The device structure according to any of one examples 1 through 8, where a first terminal of the first capacitor is coupled to the first terminal of the first transistor and a first terminal of the second capacitor is coupled to the first terminal of the second transistor and where a second terminal of the first capacitor is coupled to a second terminal of the second capacitor.

Example 10: The device structure according to any of one examples 1 through 9, where the via is a first via and the device structure further include a third transistor and a fourth transistor on a same plane, where the third transistor is laterally separated from the fourth transistor, where a gate of the third transistor is coupled to the first interconnect line and where a gate of the fourth transistor is coupled to the second interconnect line. A third via is between the first interconnect line and the gate of the third transistor and a third capacitor is coupled to a first terminal of the third transistor and a fourth capacitor is coupled to a first terminal of the fourth transistor. A fourth interconnect line couples a second terminal of the third transistor with a second terminal of the fourth transistor, where the second interconnect line extends along a direction orthogonal to the longitudinal direction.

Example 11: The device structure according to any of one examples 1 through 10, where the via is a first via and the device structure further includes a second via coupled directly between the second interconnect line and the gate of the second transistor.

Example 12: The device structure according to any of one examples 1 through 11, where the first metallization level and the second metallization level are vertically separated by at least 20 nm Example 13: A device structure includes a first interconnect line along a longitudinal direction where the first interconnect line is within a first metallization level. A second interconnect line is parallel to the first interconnect line, where the second interconnect line is within a second metallization level. A first via is coupled between the first interconnect line and a first gate of a first transistor. A second via is coupled between the second interconnect line and a second gate of a second transistor, where the first transistor and the second transistor further include a shared gate dielectric on each of the respective first gate and the second gate, a shared channel layer on the shared gate dielectric and a shared third terminal between the first terminal and the second terminal, where the shared third terminal is over a portion of the first and the second gates. The first transistor further includes a first terminal on a first portion of the shared channel layer, where the first terminal is over a portion of the first gate, where the second transistor further includes a second terminal on a second portion of the shared channel layer and where the second terminal is over a portion of the second gate. A first capacitor is coupled to the first terminal of the first transistor and a second capacitor is coupled to the second terminal.

Example 14: The device structure according to example 13, where each of the first gate and the second gate, the gate dielectric and the shared channel layer laterally extend over the first interconnect line and the second interconnect line.

Example 15: The device structure according to any of one examples 13 through 14, where the first gate is laterally separated along the longitudinal direction from the second gate by a first distance.

Example 16: The device structure according to any of one examples 13 through 15, where second interconnect line laterally is separated from the first interconnect line by a first distance.

Example 17: The device structure according to any of one examples 13 through 16, where the first interconnect line laterally overlaps the second interconnect line.

Example 18: A method to fabricate a device structure includes forming a first interconnect line within a first metallization level, where the first interconnect line extends along a first direction. The method further includes forming a second interconnect line within a second metallization level, where the second metallization level is above the first metallization level and forming a first via on the second interconnect line. The method further includes forming a second via on the first interconnect line and forming a first transistor on the first via. The method further includes forming a second transistor on the second via and forming a first capacitor on a first terminal of the first transistor. The method further includes forming a second capacitor on a first terminal of the second transistor and forming a third interconnect line connecting a second terminal of the first transistor and a second terminal of the second transistor, where the third interconnect line extends orthogonally to the first interconnect line.

Example 19: The method according to example 18, where the forming the first via and the second via includes depositing a first etch stop layer on the first interconnect line, depositing a dielectric on the first etch stop layer and depositing a second etch stop layer on the dielectric. The method further includes etching a first opening in the second etch stop layer, in the dielectric and in the first etch stop layer and depositing a first conductive material in the first opening on the first interconnect line. The method further includes removing excess first conductive material from a region outside of the first opening, forming a second opening in the second etch stop layer, depositing a second conductive material in the second opening on the second interconnect line and removing excess second conductive material from a region outside of the second opening.

Example 20: The method according to example 18, where the forming the second interconnect line further includes extending the first interconnect line laterally to overlap the first interconnect line, and where forming the first capacitor and second capacitor further includes forming a bridging plate between a top electrode of the first capacitor with a top electrode of the second capacitor.

Device structures including vertically and laterally separated word lines each coupled with transistors that are further coupled with a respective capacitor to form bitcells are described herein. In the above description, for purposes of explanation, numerous specific details are set forth in order to provide a thorough understanding of certain embodiments. It will be apparent, however, to one skilled in the art that certain embodiments can be practiced without these specific details. In other instances, structures and devices are shown in block diagram form in order to avoid obscuring the description.

Besides what is described herein, various modifications may be made to the disclosed embodiments and implementations thereof without departing from their scope. Therefore, the illustrations and examples herein should be construed in an illustrative, and not a restrictive sense. The scope of the invention should be measured solely by reference to the claims that follow.

What is claimed is:

1. A device structure comprising:
a first interconnect line along a longitudinal direction, wherein the first interconnect line is within a first metallization level;
a second interconnect line parallel to the first interconnect line, wherein the second interconnect line is within a second metallization level;
a first transistor adjacent to a second transistor, the second transistor laterally separated from the first transistor, wherein a gate of the first transistor is coupled to the first interconnect line and wherein a gate of the second transistor is coupled to the second interconnect line;
a via between the first interconnect line and the gate of the first transistor;
a first capacitor and a second capacitor on a side of the first and second transistors opposite the first and second metallization levels, wherein the first capacitor is coupled to a first terminal of the first transistor and the second capacitor is coupled to a first terminal of the second transistor; and
a third interconnect line coupling a second terminal of the first transistor with a second terminal of the second transistor, the third interconnect line extending along a first direction orthogonal to the longitudinal direction, wherein:
the via is a first via comprising a first end intersecting the first interconnect line and a second end intersecting the gate of the first transistor;
the device structure further comprises a second via comprising a first end intersecting the second interconnect line and a second end intersecting the gate of the second transistor;
the first interconnect line is separated from the second interconnect line by a first vertical thickness measured along a second direction orthogonal to the first and the longitudinal directions;
the second interconnect line has a second vertical thickness measured along the second direction;
the second via has a third vertical thickness measured along the second direction;
the first via has a fourth vertical thickness measured along the second direction and wherein the fourth vertical thickness is substantially equal to a sum of the first, the second and the third vertical thicknesses.

2. The device structure of claim 1, wherein the second interconnect line is laterally separated from the first interconnect line by a first distance and the second transistor is laterally separated from the first transistor by a second distance.

3. The device structure of claim 2, wherein the first distance is less than the second distance.

4. The device structure of claim 2, wherein the first distance is zero.

5. The device structure of claim 1, wherein the first interconnect line laterally overlaps the second interconnect line.

6. The device structure of claim 1, wherein the first interconnect line and the second interconnect line each have a respective first lateral width as measured along a third direction orthogonal to the longitudinal direction, and wherein the first transistor and the second transistor each have a respective second lateral width as measured along the third direction and wherein the first lateral width is greater than the second lateral width.

7. The device structure of claim 1, wherein a first terminal of the first capacitor is coupled to the first terminal of the first transistor and a first terminal of the second capacitor is coupled to the first terminal of the second transistor and wherein a second terminal of the first capacitor is coupled to a second terminal of the second capacitor.

8. A device structure comprising:
a first interconnect line along a longitudinal direction, wherein the first interconnect line is within a first metallization level;
a second interconnect line parallel to the first interconnect line, wherein the second interconnect line is within a second metallization level;
a first transistor adjacent to a second transistor, the second transistor laterally separated from the first transistor, wherein a gate of the first transistor is coupled to the first interconnect line and wherein a gate of the second transistor is coupled to the second interconnect line;
a via between the first interconnect line and the gate of the first transistor;
a first capacitor and a second capacitor on a side of the first and second transistors opposite the first and second metallization levels, wherein the first capacitor is coupled to a first terminal of the first transistor and the second capacitor is coupled to a first terminal of the second transistor; and
a third interconnect line coupling a second terminal of the first transistor with a second terminal of the second transistor, the third interconnect line extending along a first direction orthogonal to the longitudinal direction,
wherein the via is a first via and the device structure further comprises:
a third transistor and a fourth transistor on a same plane, the third transistor laterally separated from the fourth transistor, wherein a gate of the third transistor is coupled to the first interconnect line and wherein a gate of the fourth transistor is coupled to the second interconnect line;
a third via between the first interconnect line and the gate of the third transistor;
a third capacitor coupled to a first terminal of the third transistor and a fourth capacitor coupled to a first terminal of the fourth transistor; and
a fourth interconnect line coupling a second terminal of the third transistor with a second terminal of the fourth transistor, the second interconnect line extending along a direction orthogonal to the longitudinal direction.

9. The device structure of claim 8, wherein the via is a first via and the device structure further comprises a second via coupled between the second interconnect line and the gate of the second transistor.

10. A method to fabricate a device structure, the method comprising:

forming a first interconnect line within a first metallization level, the first interconnect line extending along a first direction;

forming a second interconnect line within a second metallization level, wherein the second metallization level is above the first metallization level;

forming a first via on the first interconnect line and a second via on the second interconnect line, wherein the forming the first via and the second via comprises:
  depositing a first etch stop layer on the first interconnect line;
  depositing a dielectric on the first etch stop layer;
  depositing a second etch stop layer on the dielectric;
  etching a first opening in the second etch stop layer, in the dielectric and in the first etch stop layer;
  depositing a first conductive material in the first opening on the first interconnect line;
  removing excess first conductive material from a region outside of the first opening;
  forming a second opening in the second etch stop layer;
  depositing a second conductive material in the second opening on the second interconnect line; and
  removing excess second conductive material from a region outside of the second opening;

forming a first transistor over the first via and electrically coupled to the first interconnect line through the first via;

forming a second transistor over the second via and electrically coupled to the second interconnect line through the second via;

forming a first capacitor over a plane of the first and second transistors and on a side of the transistors opposite the first and second interconnect lines, the first capacitor coupled to a first terminal of the first transistor;

forming a second capacitor over the plane of the first and second transistors and on a side of the transistors opposite the first and second interconnect lines, the second capacitor coupled to a first terminal of the second transistor; and forming a third interconnect line connecting a second terminal of the first transistor and a second terminal of the second transistor, wherein the third interconnect line extends orthogonally to the first interconnect line.

11. The method of claim 10, wherein the forming the second interconnect line further comprises extending the second interconnect line laterally to overlap the first interconnect line, and wherein forming the first capacitor and the second capacitor further comprises forming a bridging plate between a top electrode of the first capacitor with a top electrode of the second capacitor.

* * * * *